(12) United States Patent
Jensen

(10) Patent No.: US 7,570,707 B2
(45) Date of Patent: Aug. 4, 2009

(54) DIGITAL DELAY ELEMENT FOR DELAY MISMATCH CANCELLATION IN WIRELESS POLAR TRANSMITTERS

(75) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 846 days.

(21) Appl. No.: 10/925,485

(22) Filed: Aug. 25, 2004

(65) Prior Publication Data

US 2006/0045205 A1 Mar. 2, 2006

(51) Int. Cl.
*H04K 1/02* (2006.01)
(52) U.S. Cl. .................................... 375/296
(58) Field of Classification Search ......... 375/295–297, 375/300, 302, 259, 268, 269, 271, 284, 285; 455/149, 127.1, 91, 114.2, 114.3; 330/149; 341/50, 52, 54, 61, 122, 123; 708/100, 200, 708/290, 300, 313, 800, 801, 845, 846, 847
See application file for complete search history.

(56) References Cited

U.S. PATENT DOCUMENTS 5,732,107 A * 3/1998 Phillips et al. .............. 375/296

6,072,364 A * 6/2000 Jeckeln et al. .............. 330/149
6,304,140 B1 * 10/2001 Thron et al. ................ 330/149
6,304,619 B1 * 10/2001 Citta et al. ................... 375/343
6,882,217 B1 * 4/2005 Mueller ......................... 330/2
2005/0079835 A1 * 4/2005 Takabayashi et al. .... 455/127.1

FOREIGN PATENT DOCUMENTS

WO WO 2004032345 A1 * 4/2004

OTHER PUBLICATIONS

Lohita et al., "Power amplifier linearization using cubic spline interpolation", IEEE 43rd Vehicular Technology Conference, May 18-20, 1993, pp. 676-679.*

* cited by examiner

*Primary Examiner*—David C Payne
*Assistant Examiner*—Vineeta S Panwalkar
(74) *Attorney, Agent, or Firm*—Garlick Harrison & Markison; James A. Harrison; Holly L. Rudnick

(57) ABSTRACT

A circuit and method therefor provides programmable digital delay that is produced to introduces a delay in either an envelope or a phase signal path of an RF polar transmitter in order to eliminate the delay mismatch between the two paths. For two signal paths, a faster signal may be delayed by a digital processor or a slower signal may be transmitted early so that signals in the two signal paths arrive at a specified circuit node in synchronization. Timing shift may be implemented in either the envelope signal path or the phase signal path and may be used to reduce or increase the timing of a signal path.

17 Claims, 24 Drawing Sheets

Details of the "Envelope Delay Adjustment" block or, equivalently, the "Phase Delay Adjustment" block RF transmitter architecture for constant-envelope modulation schemes

-- PRIOR ART --

Typical output of the PA of the RF transmitter shown in Figure 1 for constant-envelope modulation schemes

-- PRIOR ART -- details of an example translational loop RF transmitter
-- PRIOR ART --

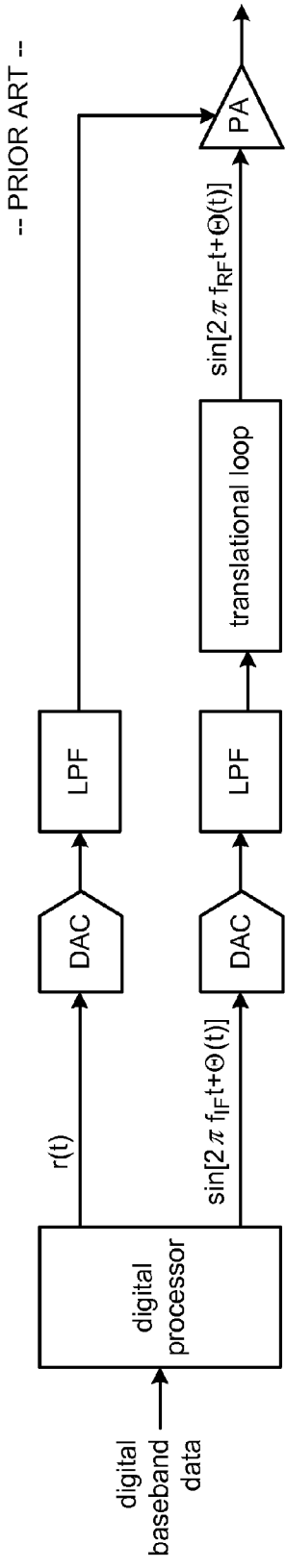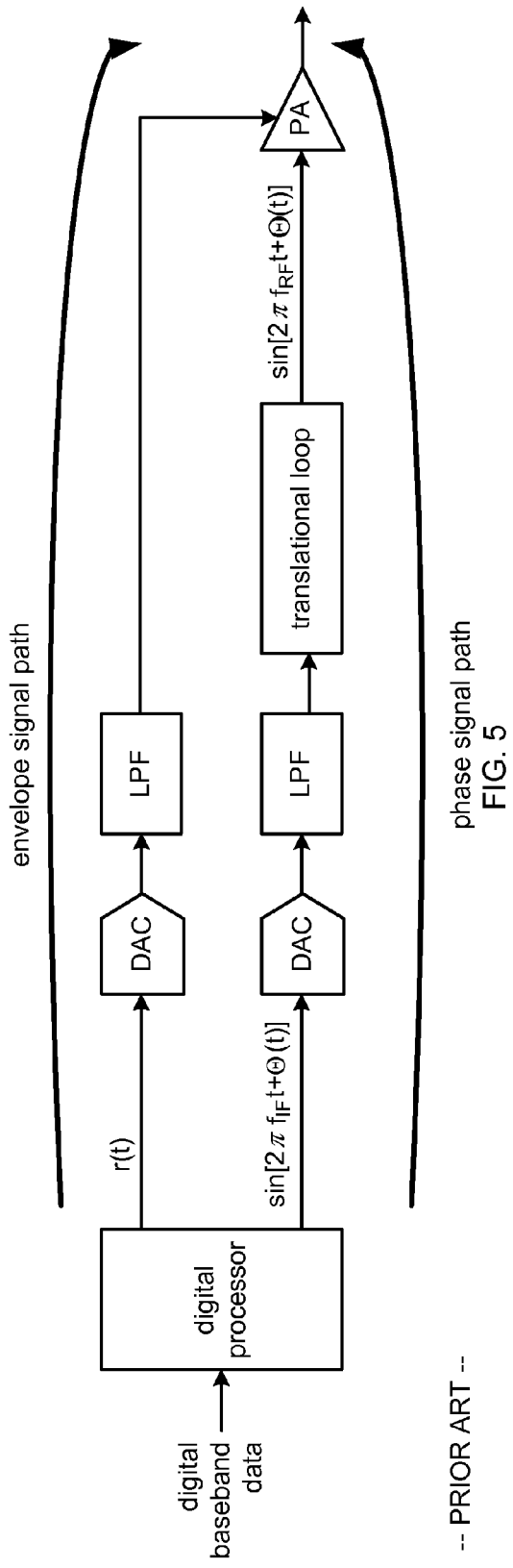

Typical envelope signal, r(t), of an RF polar transmitter
-- PRIOR ART --

Typical output of the translational loop portion of an RF polar transmitter
-- PRIOR ART --

Typical output of an RF polar transmitter PA resulting from multiplying the envelope signal of Figure 6 with the translational loop output of Figure 7

-- PRIOR ART --

RF polar transmitter
-- PRIOR ART --

Ideal RF signal output power spectrum corresponding to the EDGE cellular telephony standard frequency

-- PRIOR ART --

Spectral mask of the EDGE cellular telephony standard in the frequency range 0-1MHz.

-- PRIOR ART -- example RF polar transmitter PA output with delay mismatch between the envelope and phase signal paths

-- PRIOR ART --

RF signal output power spectrum corresponding to an EDGE signal with 20ns delay mismatch between the envelope and phase signal paths of the RF polar transmitter

-- PRIOR ART --

RF signal output power spectra corresponding to an EDGE signal with various delay mismatches between the envelope and phase signal paths of the RF polar transmitter

-- PRIOR ART --

An example signal and a delayed version thereof. The signal delay is labeled 'dt'.
-- PRIOR ART --

RF polar transmitter employing the invention

RF polar transmitter employing the invention

Details of the "Envelope Delay Adjustment" block of Figure 16 or, equivalently, the "Phase Delay Adjustment" block of Figure 17

Details of Signal Buffer block 22 of Figure 18

Details of Derivative Estimation block 26 of Figure 18

Details of Derivative Estimation block 26 of Figure 18

Details of CCS Coefficient Calculation block 24 of Figure 18

Details of CCS Evaluation block 28 of Figure 18

Demonstration of the effectiveness of the invention for an example RF polar transmitter with an envelope and phase signal path delay mismatch of 52.884615 ns. for an EDGE signal Interpolation example

DIGITAL DELAY ELEMENT FOR DELAY MISMATCH CANCELLATION IN WIRELESS POLAR TRANSMITTERS

BACKGROUND

1. Technical Field

The present invention relates to communications and, more particularly, wideband communication systems that require phase or amplitude time shifts to compensate for downstream delays experienced in one of a plurality of circuit paths.

2. Related Art

Modern RF transmitters for applications, such as cellular, personal, and satellite communications, employ digital modulation schemes such as frequency shift keying (FSK) and phase shift keying (PSK), often in combination with Code Division Multiple Access (CDMA) communication. Some of these communication schemes, for example the 270.83 kbit/s binary Gaussian FSK employed is the GSM cellular telephony standard, have constant envelopes and the transmitter signal, $s_{RF}(t)$. They can be represented mathematically as $$s_{RF}(t)=R\cos(2\pi f_c t+\theta(t)), \quad (1)$$

where R denotes a constant amplitude, $f_c$ denotes the RF carrier frequency, and $\theta(t)$ denotes the information bearing part of the transmitted signal. FIG. 1 is a block diagram of an example transmitter appropriate for such constant-envelope modulation schemes, also referred to as a translational loop transmitter. In this transmitter architecture, the digital baseband data enters a digital processor that performs the necessary pulse shaping and modulation to produce an intermediate frequency (IF) carrier $f_{IF}$ signal. The resulting digital signal is converted to analog using a digital-to-analog converter (DAC) and a low pass filter (LPF) filters out undesired digital images of the IF signal. A translational loop, for example, a phase locked loop (PLL), then translates, or shifts, the IF signal to the desired RF frequency channel and a power amplifier (PA) delivers the appropriate transmit power to the antenna.

FIG. 1 is a functional block diagram of a radio frequency transmitter architecture for constant-envelope modulation schemes. As may be seen, a digital processor is coupled to receive digital baseband data and produces a digital waveform characterized by an intermediate frequency and a phase. The output of the digital processor is produced to a digital-to-analog converter (DAC) that is capable of processing intermediate frequency digital data while avoiding unnecessary quantization noise to produce an analog outgoing signal to a low pass filter. The low pass filter removes harmonics of the analog output of the DAC and produces an outgoing low pass filtered signal to a translational loop that up-converts the analog signal from an intermediate frequency to a radio frequency. The phase information originally produced by the digital processor is maintained in the RF signal produced by the translational loop to a power amplifier for amplification and radiation from an antenna.

The RF transmitter architecture of FIG. 1 is simplistic and is intended to represent various embodiments of RF transmitters, including embodiments in which the processing described occurs for both in-phase and quadrature phase signal paths (I and Q signal paths).

FIG. 2 is a signal diagram that illustrates operation of a typical frequency modulated waveform. More specifically, the signal of FIG. 2 illustrates the transmission of a bit pattern that either is equal to 1 0 1 1 0 or 0 1 0 0 1. As may be seen, the information is represented by the carrier being modulated at one of two different frequencies which represent to two logic states "0" and "1". This signal is a typical output of a power amplifier of the RF transmitter shown in FIG. 1 for constant-envelope modulation schemes.

FIG. 3 is a functional block diagram of an alternative translational loop RF transmitter. One typical application of the RF transmitter of FIG. 3 is GSM cellular telephony, though the concepts may readily be applied to other types of communication networks. In FIG. 3, it is assumed that a digital processor delivers the phase signal $\theta(t)$ to the transmitter for further processing and RF transmission. The transmitter is typically a digital baseband processor that performs the necessary pulse shaping, modulation, and interpolation filtering, followed by in-phase and quadrature digital-to-analog converters (DACs), low pass reconstruction filters (LPFs), and analog baseband mixers. A summing node combines the mixer outputs that are followed by low pass filtering. The remaining components of the transmitter are a phase and frequency detector (PFD), 26 MHz crystal reference (X-TAL), a charge pump (CP), a loop low pass filter (LOOP FILTER), a voltage controlled oscillator (VCO), a pair of offset mixers, as well as appropriate low pass filters. RF channel selection is achieved by employing a Fractional N frequency synthesizer. A qualitative description of the operation of the translational loop is as follows. It is easy to show that low pass filtering the sum of the mixing products of the baseband I & Q components with down-converted RF output I & Q components generates a 26 MHz sinusoid whose excess phase component equals the difference between the desired baseband phase signal and the RF output phase signal. The 26 MHz carrier is extracted by the PFD whose output is the phase error signal.

With proper PLL design, the closed loop tracking action causes the error signal to approach zero; hence, the phase of the RF output carrier at 900 MHz tracks the phase of the baseband signal, as desired.

Other types of digital communication schemes, such as the $3\pi/8$ offset, 8-level PSK employed in the EDGE cellular telephony standard, have non-constant envelope and the transmitter signal, $s_{RF}(t)$, can therefore be represented in quadrature form as $$s_{RF}(t)=i(t)\cos(2\pi f_c t)+q(t)\sin(2\pi f_c t), \quad (2)$$

or, equivalently, in polar form as $$s_{RF}(t)=r(t)\cos(2\pi f_c t+\theta(t)), \quad (3)$$

where both r(t) and $\theta(t)$ are information bearing components of the transmitted signal. The signal components r(t) and $\theta(t)$ are referred to as the envelope and phase of $s_{RF}(t)$, respectively.

FIG. 4 is a block diagram of an example RF transmitter architecture appropriate for non-constant-envelope modulation schemes. This type of transmitter is also referred to as a polar transmitter or an envelope elimination and restoration (EER) transmitter. As can be seen from FIG. 4, the digital baseband processor splits the signal into an envelope and phase component, converts the phase component to the RF via a translational loop and joins the signals at the RF via an amplitude modulated PA. This PA generates the signal defined in (3) by effectively multiplying the envelope signal with the translational loop output. The magnitude of the envelope component (magnitude component) serves to modulate a signal and power level of the power amplifier. FIG. 5 defines the envelope signal path and phase signal path of the RF polar transmitter of FIG. 4.

FIG. 6 shows a typical envelope signal, r(t), of an RF polar transmitter employed in an enhanced data rate GSM evolution (EDGE) cellular telephone system. FIG. 7 is a typical output of the translational loop section of the polar transmitter employed in EDGE cellular telephony. FIG. 8 is the PA output corresponding to modulating the translational loop output with the envelope signal. As is apparent, the resulting transmitter signal contains both amplitude and phase information.

FIG. 9 shows further details of an example implementation of the polar transmitter for the EDGE cellular telephony application. In this block diagram, it is assumed that a digital processor delivers the envelope and phase signals, r(t) and θ(t), to the transmitter for further processing and RF transmission. The envelope signal is operated upon by a digital processor that performs the necessary interpolation filtering and quantization prior to digital-to-analog conversion by a DAC. Undesired digital images of the envelope signal are filtered out by the LPF. After filtering, the envelope signal is used to directly modulate the PA output. The operation of the translational loop section of the transmitter is identical to the operation described in FIG. 3 for the constant-envelope transmitter. FIG. 10 shows an example of an ideal RF transmitter output signal power spectrum corresponding to the EDGE cellular telephony standard. The power spectrum is given in dB relative to the center of the signal, and the frequency scale is relative to the RF carrier frequency. In practice, the power spectrum emitted from an EDGE transmitter will not be ideal due to various imperfections in the RF transmitter circuitry. Thus, quality measures of the transmitter performance have been established as part of the EDGE standard and minimum requirements have been set. One quality measure that relates to the RF signal power spectrum is the so-called spectral mask, as shown in FIG. 11. This mask represents the maximum allowable levels of the power spectrum as a function of frequency offset from the RF carrier in order for a given transmitter to qualify for EDGE certification. For example, as can be seen from FIG. 11, at a frequency offset of 400 kHz (0.4 MHz), the maximum allowable emission level is −54 dB relative to the carrier (dBc). Another RF transmitter quality measure of the EDGE standard is the modulation accuracy, which relates the RF transmitter modulation performance to an ideal reference signal. Modulation accuracy is stated in root-mean-square (RMS) and peak values and is specified in percentage format. For a given transmitter to qualify for EDGE certification, the RMS modulation error must be less than 9% and the peak modulation error must be less than 30%.

One cause of performance degradation of RF polar transmitters is the so-called delay mismatch between the envelope signal and the phase signal. In the above discussion, particularly as stated in relation to equation (3), it has been assumed that the envelope and phase signals are matched in the time-domain when the envelope and translational loop output is joined at the RF frequency. However, in practical RF polar transmitters, the envelope and phase signals traverse the transmitter via different processing paths and thus may experience different signal delay before arriving at the PA. These delay variations are the result of CMOS fabrication process variations as well as temperature variations that affect the analog circuitry of the signal paths slightly differently. Such delay mismatch typically has severe impact on the spectral mask margin, while the modulation accuracy is affected to lesser degree.

FIG. 12 illustrates the concept of delay mismatch between the envelope and phase signals for an exemplary EDGE signal. Due to delay mismatch, the translational loop output is modulated by a time shifted envelope signal relative to the phase signal thereby causing an error in the transmitted RF signal. It should be noted that only delay mismatch between the envelope and phase signal paths has detrimental effect on the transmitted signal; any common delay along the paths does not affect the quality of the transmitted signal.

FIG. 13 shows an example RF signal output power spectrum corresponding to an EDGE signal with 20 nanosecond (nS) delay mismatch between the envelope and phase signal paths of the RF polar transmitter. Compared to the ideal spectrum shown in FIG. 10, the impact of delay mismatch is significant. In particular, it results in so-called spectral regrowth, which refers to the elevated power spectrum observed in the figure.

FIG. 14 shows several example RF signal output power spectra corresponding to an EDGE signal with various delay mismatches between the envelope and phase signal paths of the RF polar transmitter. The text in FIG. 14 indicates the particular values of the delay mismatch. FIG. 14 exemplifies the significant impact of delay mismatch; for example, with a delay mismatch of 80 nS or greater, the spectral mask requirement of −54 dBc at 400 kHz offset is not satisfied. In order to restore the RF transmitter performance, delay mismatch must be substantially canceled.

FIG. 15 shows an example in which an envelope signal is delayed by a slight amount, dt, to cause such delay cancellation. Equivalently, the delay cancellation could also occur along the phase signal path since only delay mismatch matters. The above discussions describe designs that are currently being considered and corresponding performance issues that relate to those designs. It is clear from the foregoing description of the related art, that what is needed, therefore, is a method and an apparatus that addresses the problem of delay mismatch to improve performance of polar transmitters that are presently being designed.

SUMMARY OF THE INVENTION

A programmable digital delay is produced by a digital processor that introduces a delay in either an envelope or a phase signal path of an RF polar transmitter in order to eliminate the delay mismatch between the two paths. While the above discussion is in terms of delay, the real problem is timing mismatch. Thus, for two signal paths, a faster signal may be delayed by a digital processor or a slower signal may be transmitted early so that signals in the two signal paths arrive at a specified circuit node in synchronization (are not mismatched in terms of timing). Thus, the many inventive embodiments may be implemented in either the envelope signal path or the phase signal path and may be used to reduce or increase the timing of a signal path to reduce or eliminate delay mismatch. The embodiments of the present invention are particularly appropriate for high performance applications, such as EDGE cellular telephony, where large dynamic range of the output signal is required. In addition, the disclosed invention provides for arbitrarily fine delay resolution, only limited by the bit-resolution of the digital processing.

The described embodiments include circuitry that implement a clamped cubic spline interpolator (CCSI) algorithm to accurately interpolate the intermediate signal produced by a digital processor reflecting data to points in-between adjacent samples of the intermediate signal as required by a specified output sampling rate. The CCSI is highly accurate due to highly accurate derivative estimates arrived at by repeated Richardson extrapolation. In one embodiment, a fourth order Richardson extrapolation is employed.

A signal buffer receives the filtered data and produces buffered samples that are N samples wide wherein N is a value determined by a Richardson formulation for generating derivative estimates. A derivative estimation block receives the buffered samples and produces at least two derivative estimates based upon the buffered samples. A coefficient calculation block then produces two polynomial coefficient values based upon the at least two derivative estimates produced by the derivative estimation block and also based upon at least two select buffered samples produced by the signal buffer. Finally, a polynomial evaluation block for producing a function value representing an estimated sample point value produces the function value (estimated signal magnitude) based upon the polynomial coefficient values and the approximate value of (x). The derivative estimation block, the coefficient calculation block and the polynomial evaluation block produce outputs that represent a time shifted value of a digital signal being transmitted.

BRIEF DESCRIPTION OF THE DRAWINGS

A better understanding of the present invention can be obtained when the following detailed description of the preferred embodiment is considered with the following drawings, in which:

FIG. 4 is a block diagram of an example RF transmitter architecture appropriate for non-constant-envelope modulation schemes;

FIG. 5 defines the envelope signal path and phase signal path of the RF polar transmitter of FIG. 4;

DETAILED DESCRIPTION OF THE DRAWINGS

Figure 16:
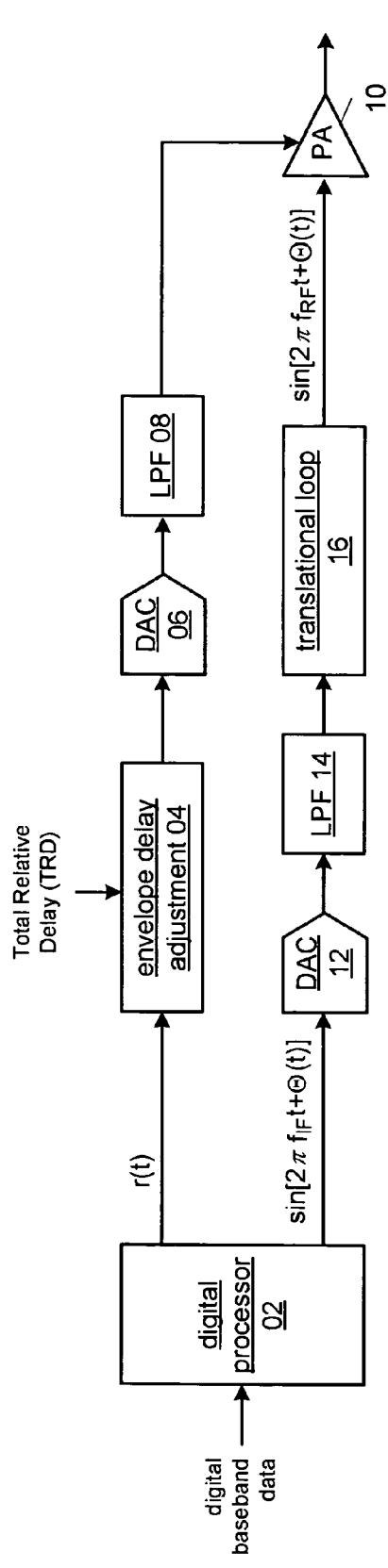
FIG. 16 is a functional block diagram of an RF polar transmitter according to one embodiment of the present invention.

FIG. 16 is a functional block diagram of an RF polar transmitter according to one embodiment of the present invention. A digital processor 02 is coupled to receive digital baseband data and produces a magnitude component and a phase component. The magnitude component is of the form r(t), while the phase component is of the form sin $[2\pi f_{IF} t + \Theta(t)]$. The magnitude component, in the embodiment of FIG. 16, is produced to an envelope delay adjustment block 04 which is further coupled to receive a total relative delay value. Envelope delay adjustment block 04 produces a time shifted magnitude component to a digital-to-analog converter 06 which produces an analog magnitude component to a low pass filter 08 which then produces a filtered analog magnitude component to a power amplifier 10. Envelope delay adjustment block 04 is operable not only to typically produce a delay, but also to advance a magnitude component relative to the phase component.

Along the phase path, the phase component is produced to a DAC 12 which converts the phase component from an outgoing digital signal to an outgoing analog signal, which outgoing analog signal is produced to low pass filter 14 which filters the outgoing analog signal and produces the outgoing analog signal to a translational loop 16 that generates an outgoing RF signal that maintains the phase information in the digital phase component produced by digital processor 02. The outgoing analog RF signal produced by translational loop 16 is produced to power amplifier 10 where the phase component is combined with the magnitude component for transmission from power amplifier 10. More specifically, the phase component is magnitude modulated in the power amplifier by the magnitude component received from low pass filter 08.

Figure 17:
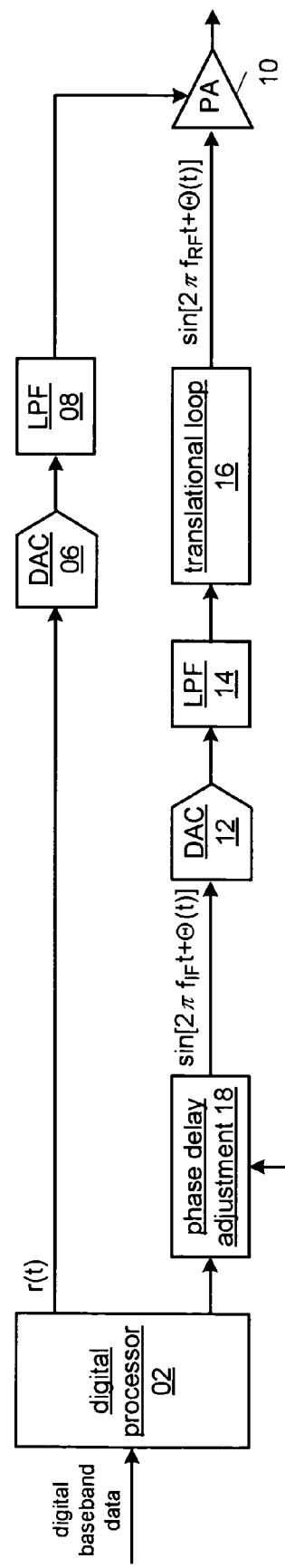
FIG. 17 is a functional block diagram of an RF polar transmitter that includes a phase delay adjustment block in a phase path according to one embodiment of the present invention.

FIG. 17 is a functional block diagram of an RF polar transmitter that includes a phase delay adjustment block in a phase path according to one embodiment of the present invention. Similarly numbered parts reflect similar circuit blocks or elements that have been previously discussed. As may be seen in FIG. 17, digital processor 02, DAC 06, low pass filter 08, DAC 12, low pass filter 14, translational loop 16 and power amplifier 10 are all the same as in FIG. 16. FIG. 17 further includes a phase delay adjustment block 18 that receives the phase component produced by digital processor 02. Phase delay adjustment block 18 is further coupled to receive a total relative delay signal and, based on the same, produces a time shifted phase component at the intermediate frequency band. The time shifted phase component is produced to DAC 12 and is processed similarly to the phase components of FIG. 16. The translational loop receives a filtered time shifted phase component from low pass filter 14 and up-converts the signal to produce a time shifted radio frequency outgoing analog signal that includes the original phase information of the phase component originally produced by digital processor 02. The time shifted radio frequency phase component received by power amplifier 10 is then magnitude modulated by the magnitude component received from low pass filter 08. As with the envelope delay adjustment block 04 of FIG. 16, phase delay adjustment block 18 is operable to introduce either a delay or an advancement of a phase component.

Figure 18:
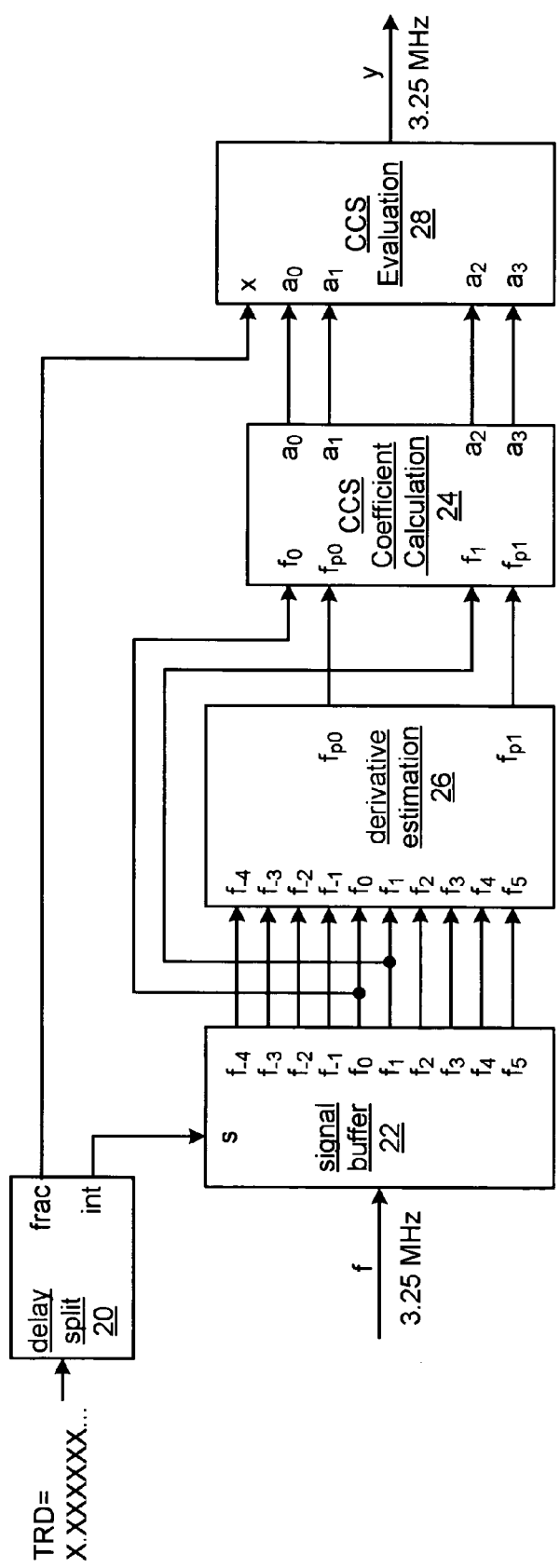
FIG. 18 is a functional block diagram of a delay adjustment block that may be used either as an envelope delay adjustment block or a phase delay adjustment block and is formed according to one embodiment of the present invention.

FIG. 18 is a functional block diagram of a delay adjustment block that may be used either as an envelope delay adjustment block or a phase delay adjustment block and is formed according to one embodiment of the present invention. Generally, one potential solution for providing adequate resolution for delay adjustments is to significantly increase a sample clock rate. For example, in one embodiment of the invention, a 3.25 MHz clock rate is utilized. If the clock rate is increased to 100 MHz, then timing shifts in the order of 10 nS or 20 nS may readily be accomplished. However, increasing the clock rate is not desirable because of circuit complexity and other issues that are created thereby. Accordingly, the delay adjustment block of FIG. 18 uses a sixth order polynomial function to estimate signal values based upon known end points (sample points) of a data stream.

While the described embodiment implements a solution of the sixth order, it is understood that a fourth order, or even a second order, solution may be implemented according to system requirements. Referring again to FIG. 18, a delay split 20 is coupled to receive a total relative delay value that is desired. Delay split 20 produces an integer indication of a unit delay to a signal buffer 22 and an indication of a fractional unit delay to a CCS coefficient evaluation block 24. A derivative estimation block 26 is coupled to receive a plurality of sample values and produces derivative estimates of a data sequence to CCS coefficient evaluation block 24. CCS coefficient evaluation block 28 produces coefficient values of the cubic polynomial based on the derivative estimates produced by derivative estimation block 26 and a pair of buffered sequence of samples substantially as shown in FIG. 18 to CCS evaluation block 28. CCS evaluation block 28 then evaluates the clamped cubic spline based upon the fractional portion received from delay split 20 and further based upon the coefficient values produced by CCS coefficient evaluation block 24.

As mentioned above, the input to the delay adjustment block in either case is referred to as TRD, and is a parameter that dictates the total amount of desired signal delay along the given signal path. The delay is specified in the number of clock cycles relative to the sampling rate of the digital processor. For example, as indicated in FIG. 18, the sampling rate for an EDGE application may be 3.25 MHz. The "Split Delay" block splits the specified delay into an integer part, labeled "int", and a fractional part, labeled "frac". For the purposes of demonstrating the described embodiment of the invention, but not an essential feature of the invention, the splitting of the TRD value occurs such that TRD="int"+"frac" and such that "frac" is always a positive number. For example, suppose

TRD=1.25, then "Split Delay" operates such that int=1, frac=0.25.

On the other hand, suppose

TRD=−0.25, then "Split Delay" operates such that int=−1, frac=0.75.

The integer part is used as a selection signal, "s", of the "Signal Buffer" block, and the fractional part, "frac", is used as the input to the "CCS Evaluation" block, as explained in the following figure.

Figure 19:
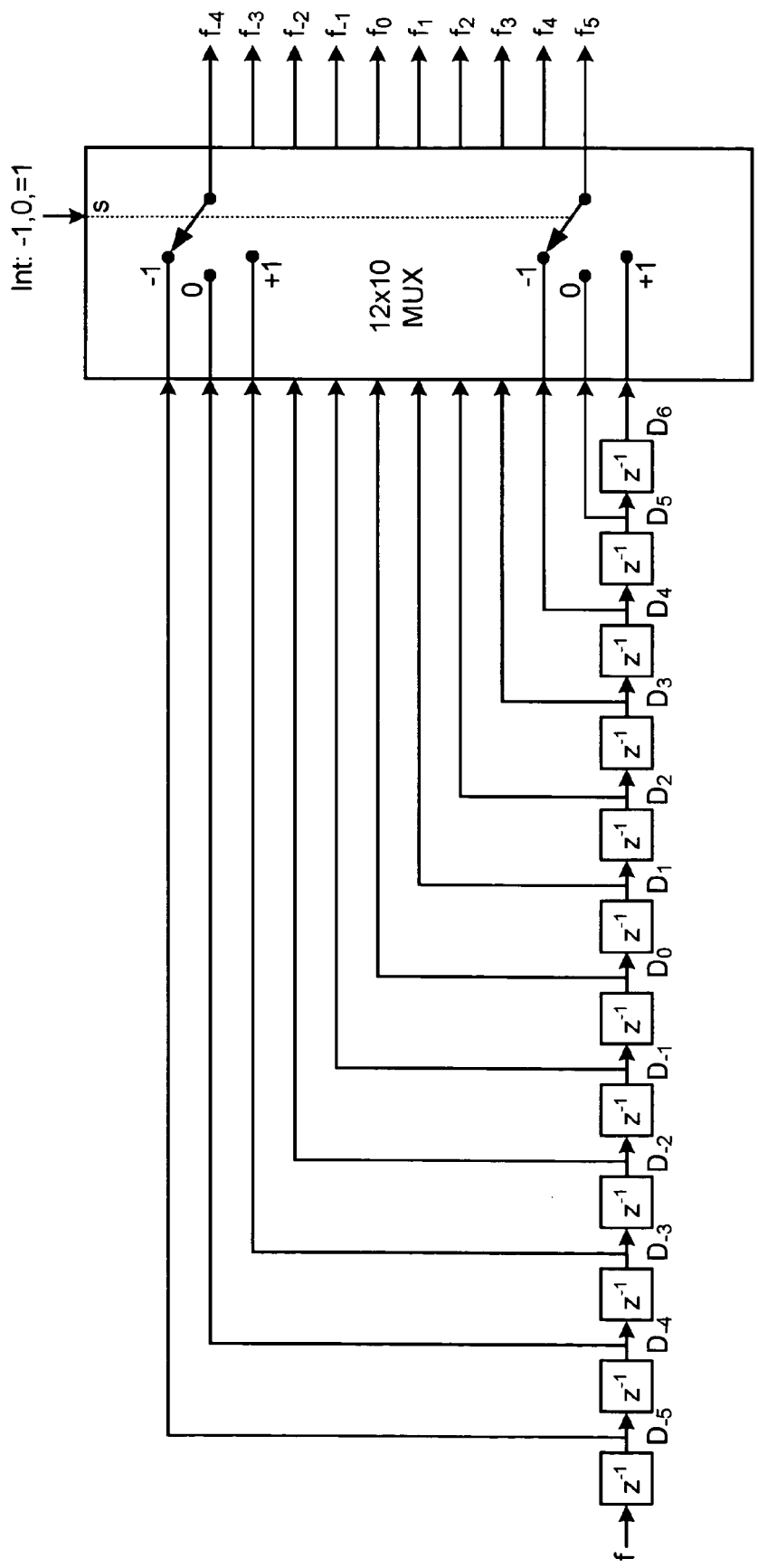
FIG. 19 shows details of a "Signal Buffer" block.

FIG. 19 shows details of the "Signal Buffer" block. The buffer consists of a delay line with 12 registers and a 12×10 MUX. The signals are multiplexed to the outputs labeled $f_{-4}$, $f_{-3}$, ..., $f_4$, $f_5$ depends upon the value of the selection signal "s". Specifically, denoting the register output $D_{-5}, D_{-4}, \ldots, D_5, D_6$, the MUX operates according to:

$$(f_{-4}, f_{-3}, \ldots, f_4, f_5) = \begin{cases} (D_{-5}, D_{-4}, \ldots, D_3, D_4), & \text{if } s = -1 \\ (D_{-4}, D_{-3}, \ldots, D_4, D_5), & \text{if } s = 0 \\ (D_{-3}, D_{-2}, \ldots, D_5, D_6), & \text{if } s = 1 \end{cases}$$

Figure 14:
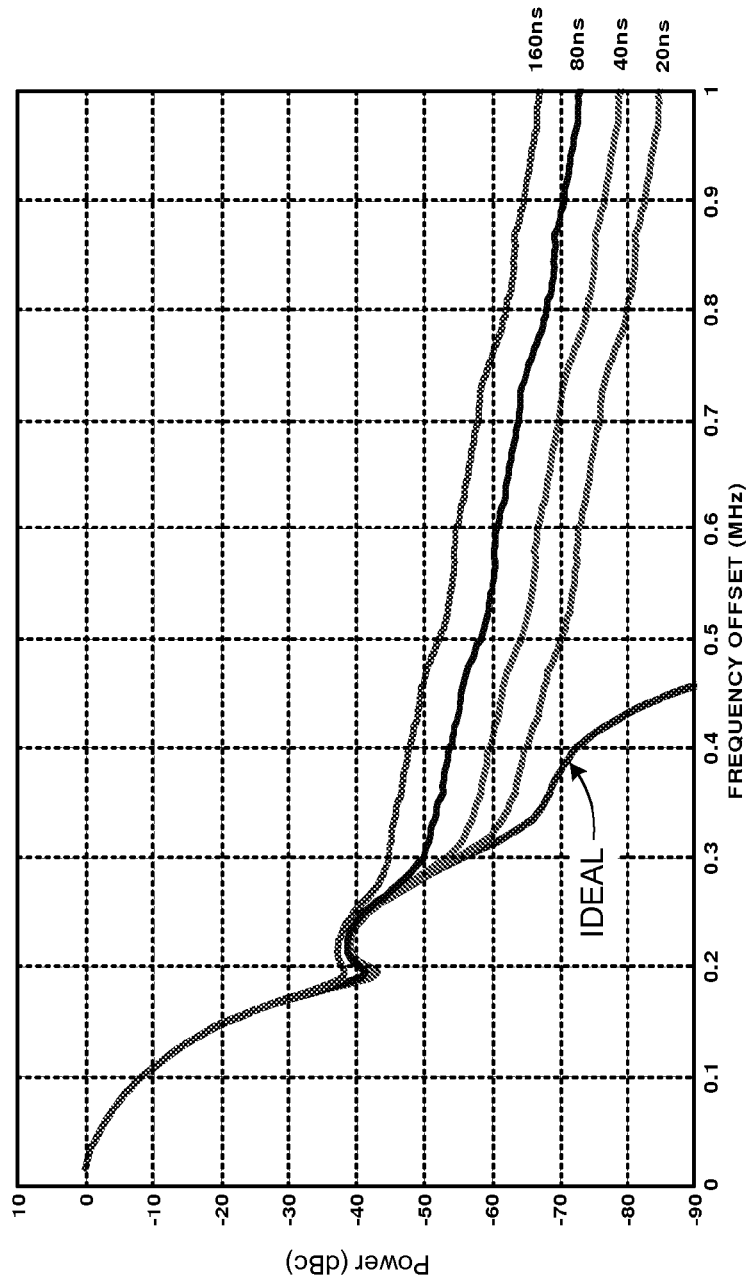
FIG. 14 shows several example RF signal output power spectra corresponding to an EDGE signal with various delay mismatches between the envelope and phase signal paths of the RF polar transmitter.
Figure 15:
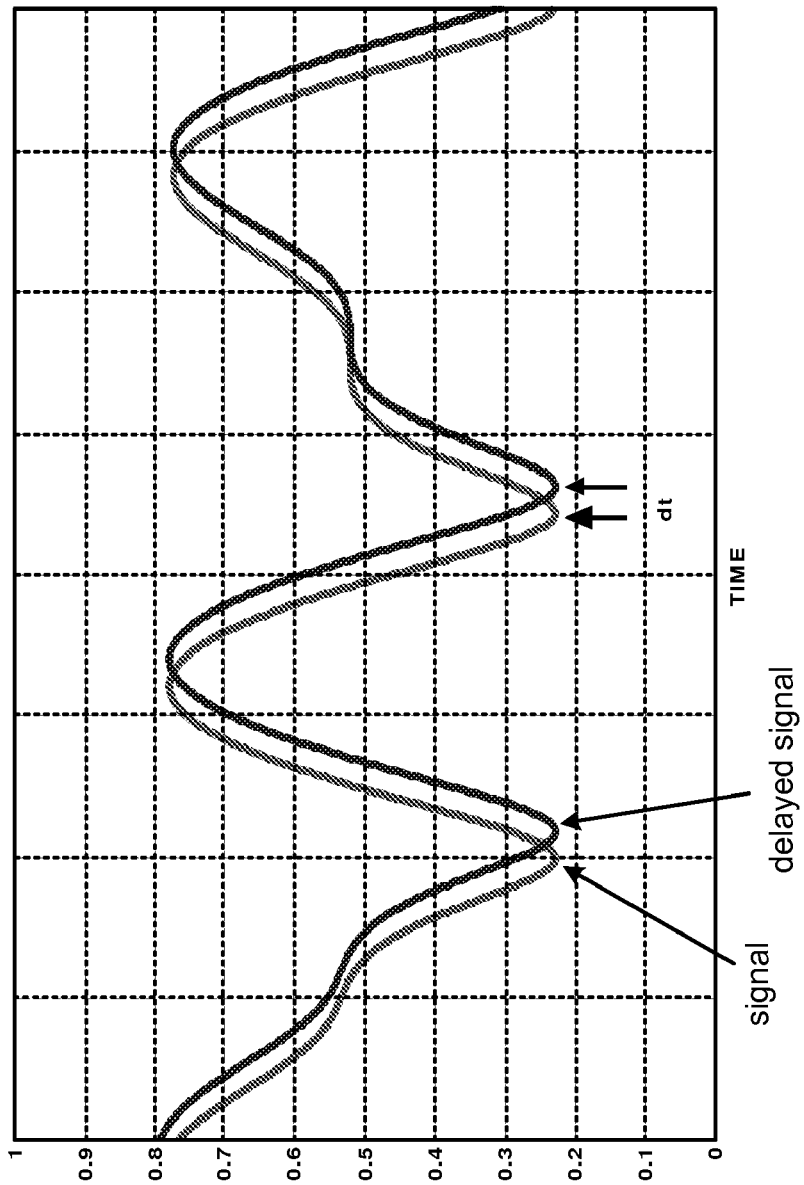
FIG. 15 shows an example in which an envelope signal is delayed by a slight amount, dt, to cause such delay cancellation.

It follows directly from the above description how "Signal Buffer" can provide integer clock delays or time shifts having values of −1, 0, and +1 relative to the clock cycle. A delay or time shift value of −1 reflects a delay of one clock cycle, a delay value of 0 is an initial value and reflects no time shift. Finally, a delay or time shift value of +1 reflects that a signal is to be advanced one whole clock cycle. It is straight-forward to accommodate for even more integer clock cycle delays by expanding the length of the delay line. However, with a clock frequency of 3.25 MHz, a single clock cycle delay corresponds to a delay adjustment resolution of approximately 325 nS. Referring back to FIG. 14, it is clear that such resolution is much too coarse to allow for sufficient delay mismatch cancellation in EDGE RF polar transmitters. Thus, fractional delay is necessary and is achieved with the use of the theory of Clamped Cubic Splines (CCSs).

To further explain the functionality of the block diagram of FIG. 18, in particular, how delays that constitute only a fraction of the clock cycle are achieved, an explanation of clamped cubic splines is helpful. In the described embodiment of the invention, logic circuitry performs a clamped cubic spline function of a cubic polynomial of the form:

$$f(x) = a_0 + a_1 x + a_2 x^2 + a_3 x^3, \quad (4)$$

where the coefficients $a_0, \ldots, a_3$ depend upon known values of the function and its derivatives in the boundary points $x_0$ and $x_1$, and where the interpolation point x (the point at which an estimate of the function value is desired) is in between the boundary points. For convenience, $f(x)$ has here been defined such that $x \in [0; 1]$. Specifically, the coefficients of the CCS are defined by $$a_0 = f(x_0)$$

$$a_1 = f'(x_0)$$

$$a_2 = 3(f(x_1) - f(x_0)) - (f'(x_1) + 2f'(x_0))$$

$$a_3 = 2(f(x_0) - f(x_1)) + f'(x_1) + f'(x_0) \quad (5)$$

In the present application the signal is generally unknown and hence the derivatives of the signal are not known a-priori. Thus, for high performance applications such as EDGE RF polar transmitters, precise estimates of the signal derivatives in the boundary points are generated. The present invention uses Taylor approximation and Richardson extrapolation to generate precise derivative estimates. Details of the approach are given in a subsequent section.

However, to continue the discussion of FIG. 18, assume that the block labeled "Derivative Estimation" in this figure generates precise estimates of the signal derivatives in the boundary points in between the appropriate samples of the desired signal. Specifically, these derivatives are evaluated as $f'(x_0)$ and $f'(x_1)$, and are labeled "fp0" and "fp1", respectively. The "CCS Coefficient Calculation" block then calculates the CCS coefficients, as defined by (4) and (5). The evaluation of the polynomial (4), and hence the fractionally delayed version of the signal, is performed by the "CCS Evaluation" block.

Richardson Extrapolation for Precise Derivative Estimates

Richardson extrapolation originates from the field of numerical analysis, where it is used to generate increasingly precise estimates of a function A(h) which depends upon a parameter h. For example, h could be the step size of a method for numerical integration or differentiation. In the following, it will be assumed that $$A(h) \to A \text{ for } h \to 0.$$

Furthermore, with the assumption that A(h) is a "smooth" function of h, i.e., sufficiently many derivatives of A(h) exist for h=0, Taylor expansion yields, $$A(h) = A + a_1 h + a_2 h^2 + \ldots + a_p h^p + O(h_{p+1}) \tag{6}$$

If k denotes the order of the method or function A(h), by definition, $$a_1 = a_2 = \ldots = a_{k-1} = 0, \tag{7}$$

and thus $$A(h) = A + a_k h^k + a_m h^m + O(h^{m+1}), \tag{8}$$

where the possibility $$a_{k+1} = a_{k+2} = \ldots = a_{m-1} = 0 \tag{9}$$

has been accommodated for.

Now let $h_1$ and $h_2$ be two given h-values—specifically, for the purposes of this application, $$h_1 = 2h_2. \tag{10}$$

From (6), $$A(h_1) = A + a_k h_1^k + a_m h_1^m + O(h_1^{m+1})$$

$$A(h_2) = A + a_k h_2^k + a_m h_2^m + O(h_2^{m+1}) \tag{11}$$

It follows that the $a_k$-term can be eliminated by multiplying the second equation with $(h_1/h_2)^k = \alpha^k$ and subtracting:

$$A = \frac{\alpha^k A(h_2) - A(h_1)}{\alpha^k - 1} + a_m \frac{\alpha^m - \alpha^k}{\alpha^k - 1} h_2^m + O(h_2^{m+1}) \tag{12}$$

or, since $\alpha = 2$, the $k^{th}$ order Richardson extrapolation is given by $$A(h_2, h_1) = A(h_2) + \frac{A(h_2) - A(h_1)}{2^k - 1}. \tag{13}$$

Note that the $k^{th}$ order Richardson extrapolation results in an mth order approximation of A. Thus, Richardson extrapolation may be repeated, this time to $m^{th}$ order, for even higher order approximations of A.

Consider next how Richardson extrapolation may be employed for highly precise derivative estimates in the evaluation of the clamped cubic spline. Forward Taylor approximation of a function $f(x)$ around the point $x_i$ yields $$f(x_i+h) = f(x_i) + hf'(x_i) + \tfrac{1}{2}h^2 f''(x_i) + \tfrac{1}{6}h^3 f'''(c), \tag{14}$$

where $$c \in [x_i; x_i+h].$$

Backward Taylor approximation of a function $f(x)$ around the point $x_i$ yields $$f(x_i-h) = f(x_i) - hf'(x_i) + \tfrac{1}{2}h^2 f''(x_i) - \tfrac{1}{6}h^3 f'''(\bar{c}), \tag{15}$$

where $$\bar{c} \in [x_i-h; x_i]$$

Subtracting (15) from (14) eliminates even order derivatives, i.e., $$f(x_i+h) - f(x_i-h) = 2hf'(x) + \tfrac{1}{6}h^3 f'''(\xi), \tag{16}$$

where $$\xi \in [x_i-h; x_i+h].$$

It follows that $$f'(x_i) = \frac{f(x_i + h) - f(x_i - h)}{2h} + O(h^2). \tag{17}$$

For fixed $x_i$, introducing the compact notation $$f(x_i + jh) = f_j, j = \ldots -2, -1, 0, 1, 2, \ldots \tag{18}$$

and performing second order Richardson extrapolation of (17) according to (13) yields $$f'_0 = \frac{f_{-2} - 8f_{-1} + 8f_1 - f_2}{12h} + O(h^4). \tag{19}$$

Analogously, $$f'_1 = \frac{f_{-1} - 8f_0 + 8f_2 - f_3}{12h} + O(h^4). \tag{20}$$

Performing Richardson extrapolation of (19) and (20), this time to fourth order, yields $$f'_0 = \frac{-f_{-4} + 40f_{-2} - 256f_{-1} + 256f_1 - 40f_2 + f_4}{360h} + O(h^6), \text{ and} \tag{21}$$

$$f'_1 = \frac{-f_{-3} + 40f_{-1} - 256f_0 + 256f_2 - 40f_3 + f_5}{360h} + O(h^6), \tag{22}$$

respectively.

It is clear that the Richardson extrapolation process can be extended to even higher orders if desired. However, as the order of the extrapolation increases, the computational complexity associated herewith increases as well.

Equations (21) and (22) may be implemented with an antisymmetric FIR filter with impulse response in the form of:

$$h(z) = \frac{1}{360}(1 - 40z^{-2} + 256z^{-3} - 256z^{-5} + 40z^{-6} - z^{-8}). \quad (23)$$

The symmetry of the Richardson extrapolation indicated by equation (23) can be exploited to reduce the number of multiplies to three rather than six since equation (23) may be rewritten as $$h(z) = \frac{1}{360}(1 - z^{-8}) + \frac{40}{360}(z^{-6} - z^{-2}) + \frac{256}{360}(z^{-3} - z^{-5}). \quad (24)$$

Returning to the details of the proposed digital delay mismatch cancellation algorithm, FIG. 19 shows the block diagram of the "Signal Buffer" appropriate for calculating derivative estimates using fourth order Richardson extrapolation. Notice namely from equations (21), (22), and (23) that to estimate the derivatives $f'_0$ and $f'_1$, a total of 10 signal values are needed; hence, as shown in FIG. 19, the "Signal Buffer" block outputs ten function values $f_{-4}, \ldots, f_5$.

Figure 20A:
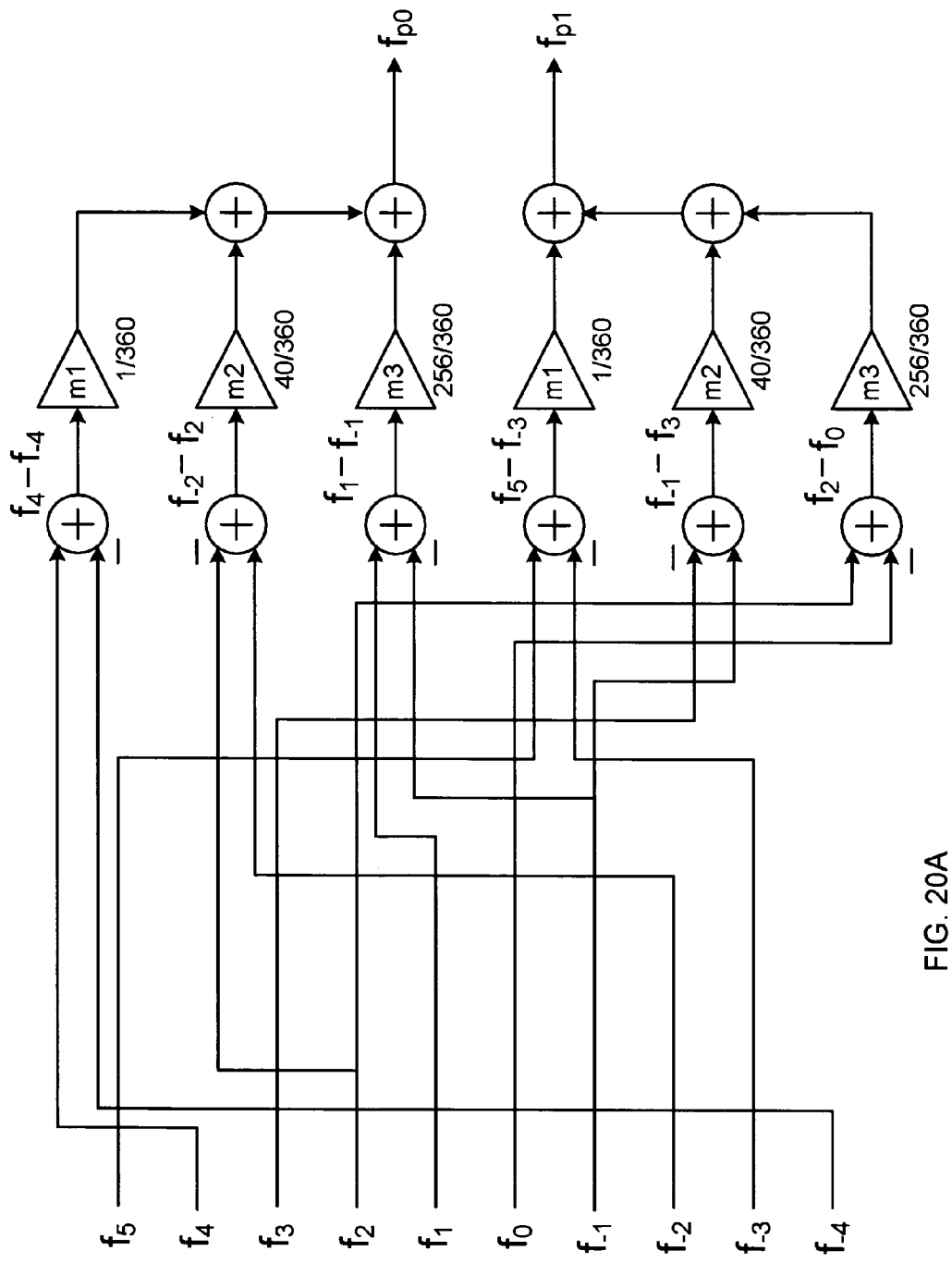
FIGS. 20A and 20B show the details of two embodiments of the "Derivative Estimation"
Figure 20B:
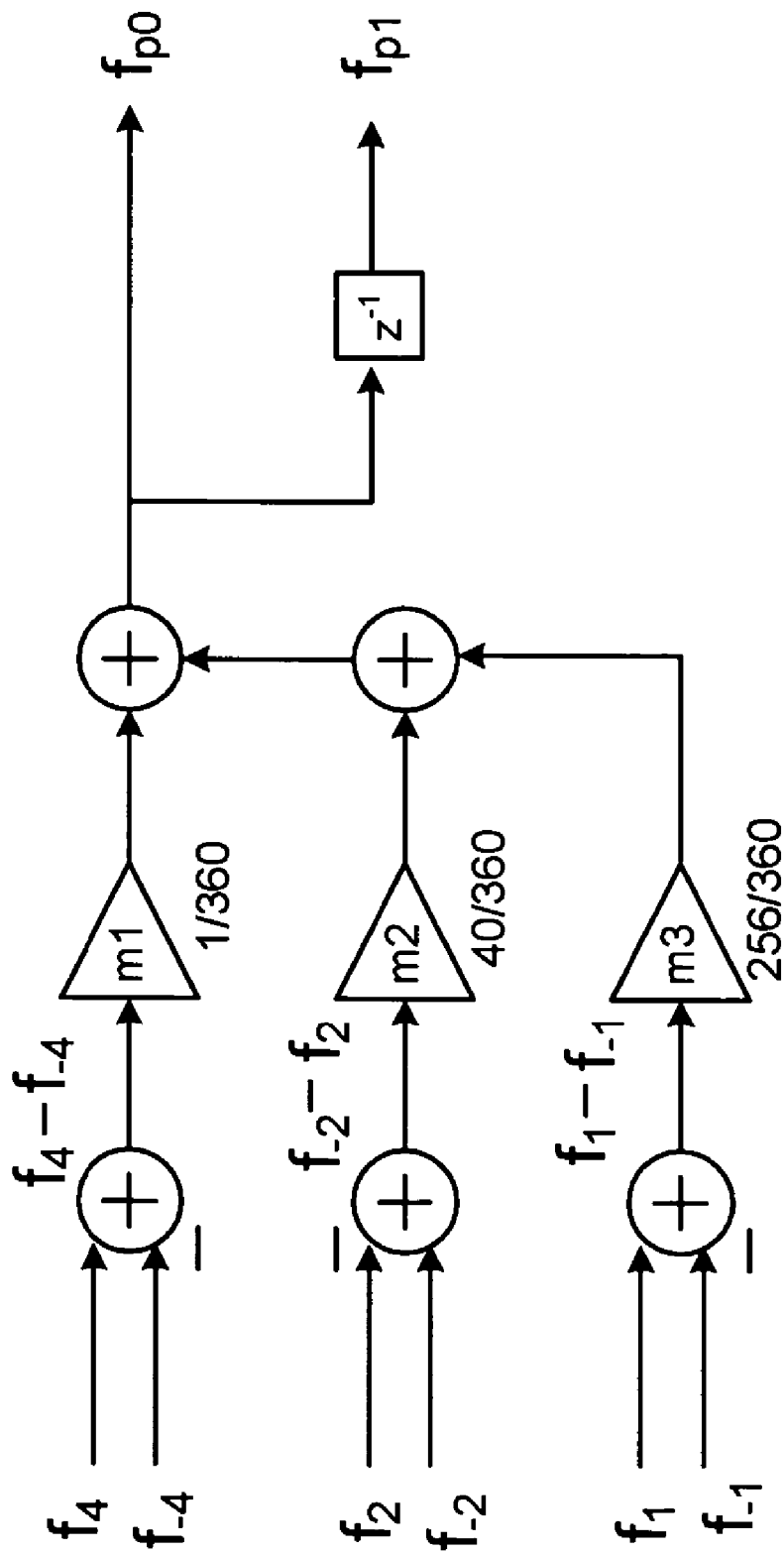

FIG. 20A and FIG. 20B show the details of two embodiments of the "Derivative Estimation" block of FIG. 18. The multipliers are shown as $m_1$, $m_2$, and $m_3$, respectively. As may be seen, FIG. 20B does not have the circuitry shown in the bottom half of the embodiment of FIG. 20A yet produces the same results. It should be noted that the inputs for the three multipliers are different from the top half of the circuitry of FIG. 20A. As the results are the same for the two embodiments, however, the circuit of FIG. 20B is advantageous for its efficiency relative to FIG. 20A.

Figure 21:
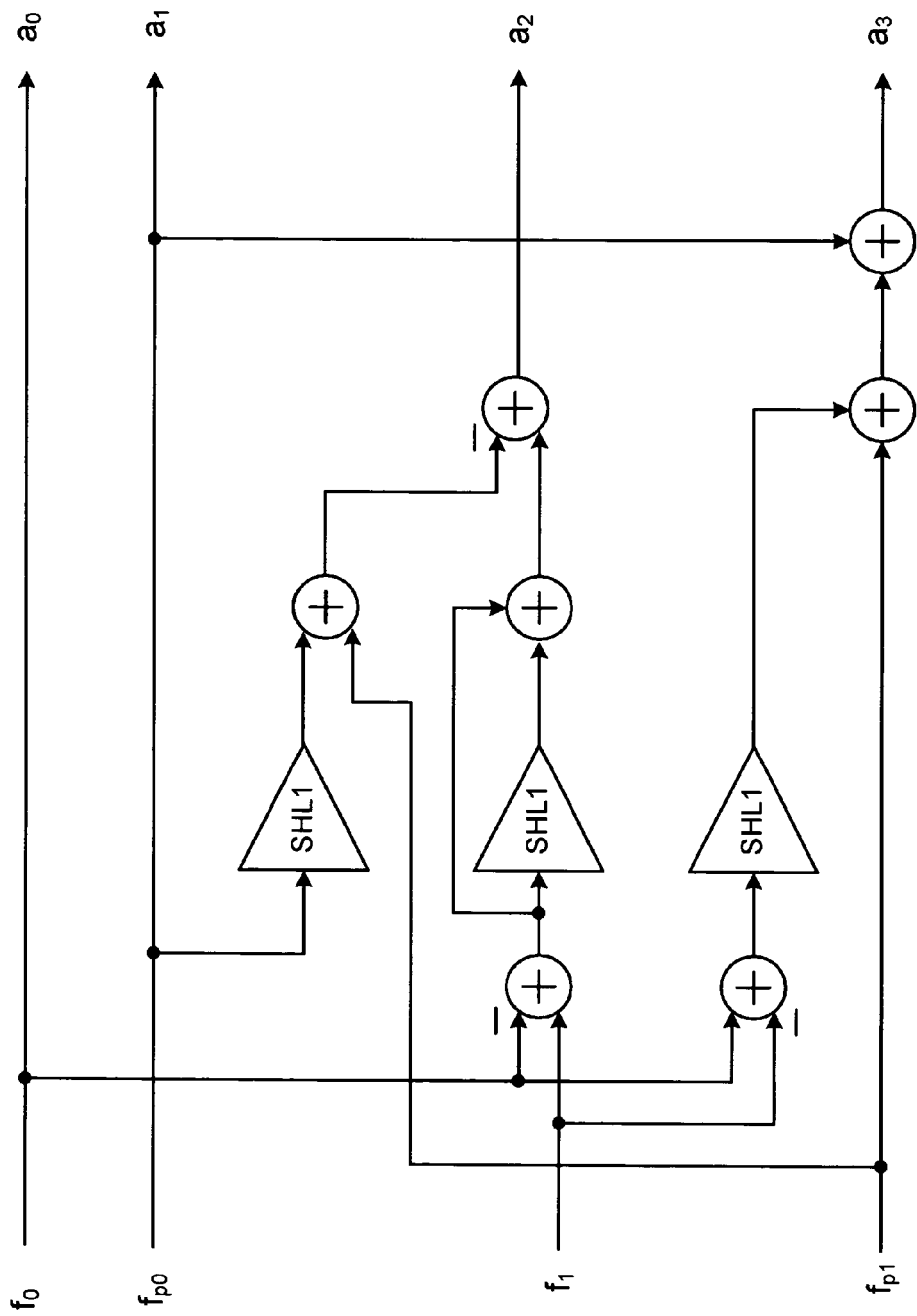
FIG. 21 shows the details of the calculation of CCS coefficients.

FIG. 21 shows the details of the calculation of the CCS coefficients. The arithmetic indicated in this figure directly follows from (5). Notice that factors of 2 and 3 are implemented as a left-shift and a left-shift and add, respectively, to achieve the functionality of multiplication but are not actual multiplication operations.

Figure 22:
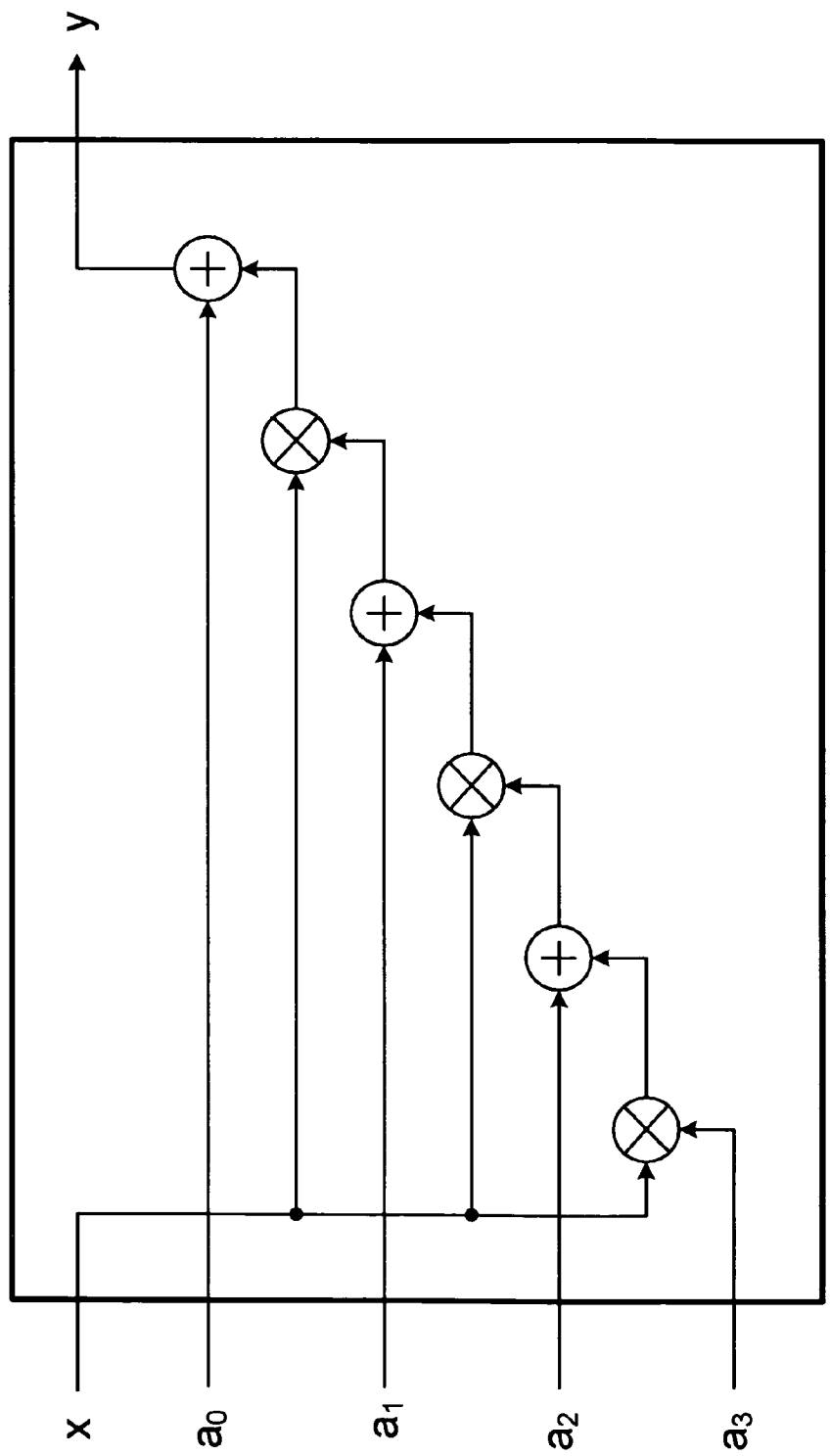
FIG. 22 is a functional schematic diagram that shows the details of the CCS evaluation block.

FIG. 22 is a functional schematic diagram that shows the details of the CCS evaluation block of FIG. 18. The method of polynomial evaluation adopted here is referred to as Horner's method. This method follows directly from (4) by noting that the cubic polynomial may be rewritten as $$f(x) = (((a_3 x) + a_2)x + a_1)x + a_0. \quad (25)$$

The advantages of Horner's method are a reduced number of multiplications necessary to evaluate the polynomial and typically more well balanced intermediate signal swings.

Figure 1:
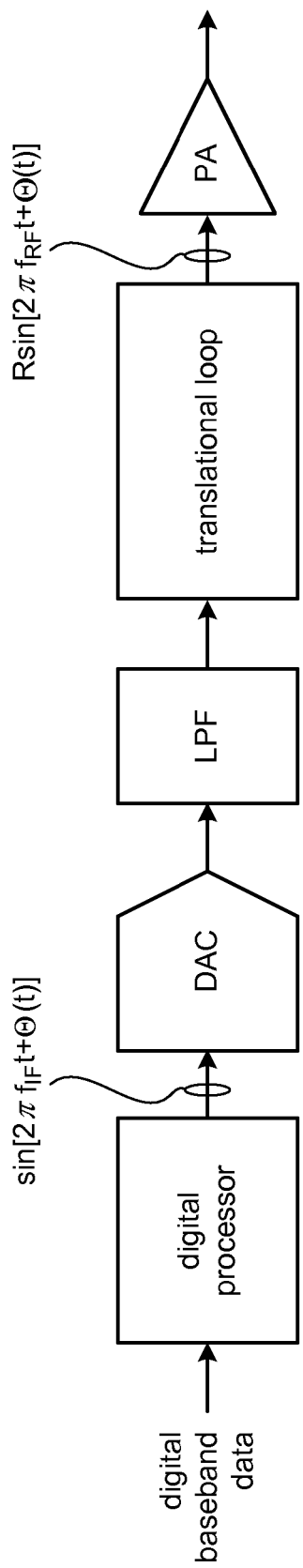
FIG. 1 is a functional block diagram of a radio frequency transmitter architecture for constant-envelope modulation schemes.
Figure 2:
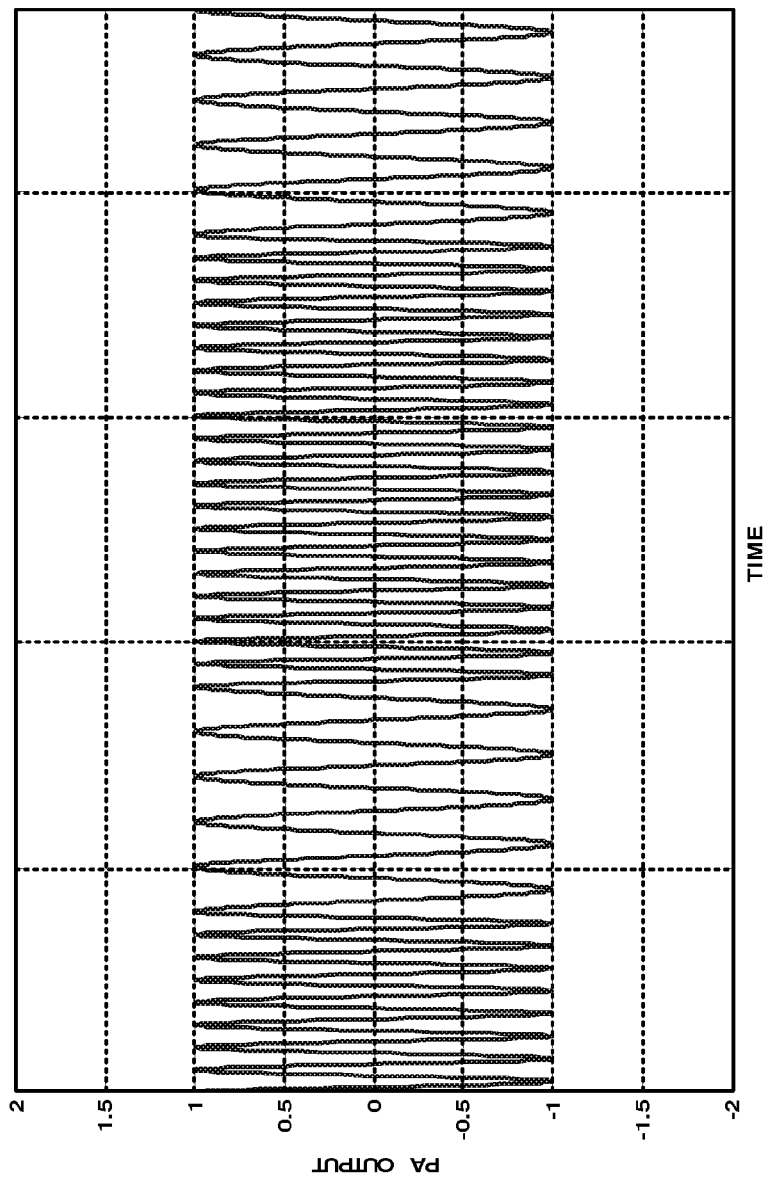
FIG. 2 is a signal diagram that illustrates operation of a typical frequency modulated waveform.
Figure 3:
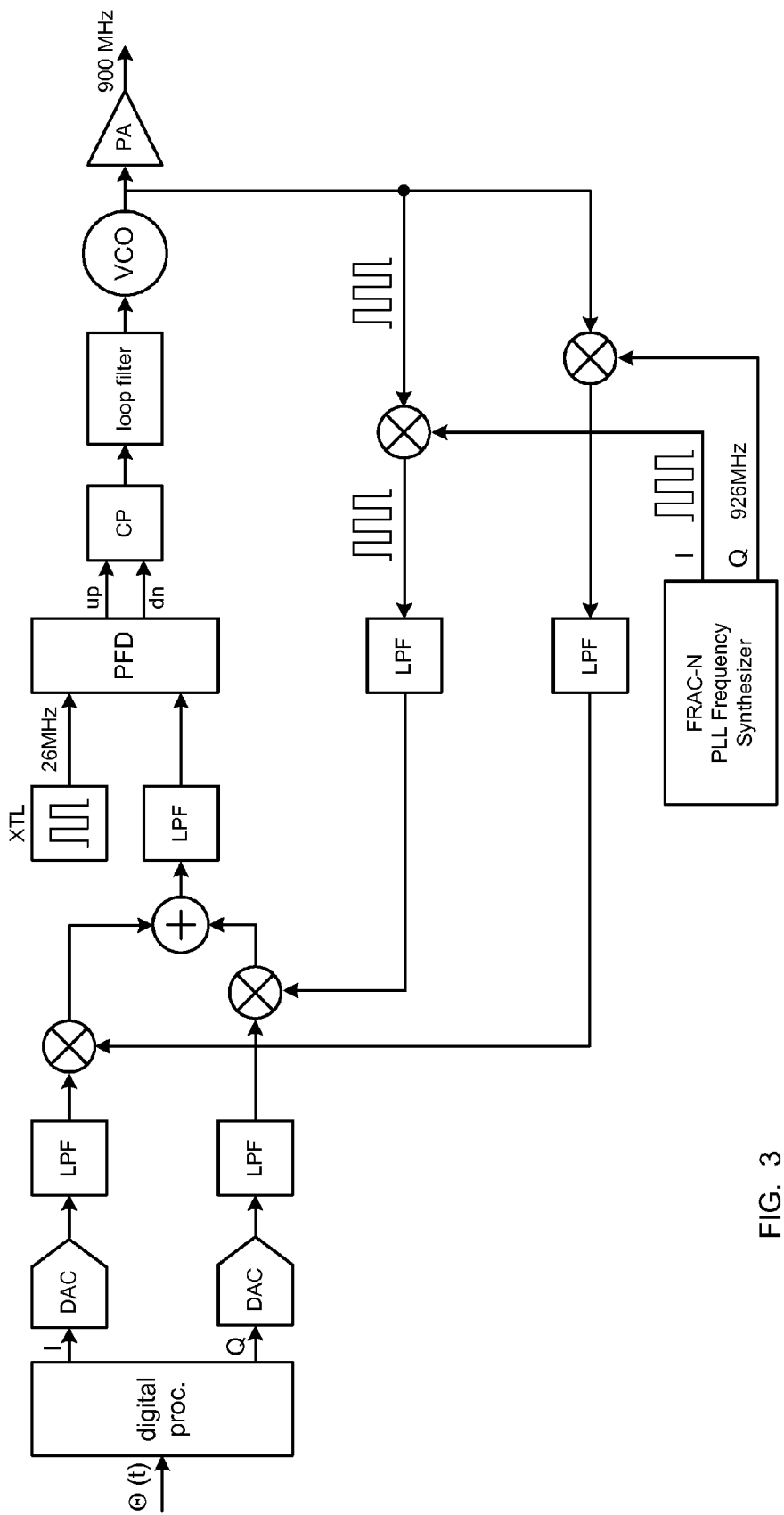
FIG. 3 is a functional block diagram of an alternative translational loop RF transmitter.
Figure 6:
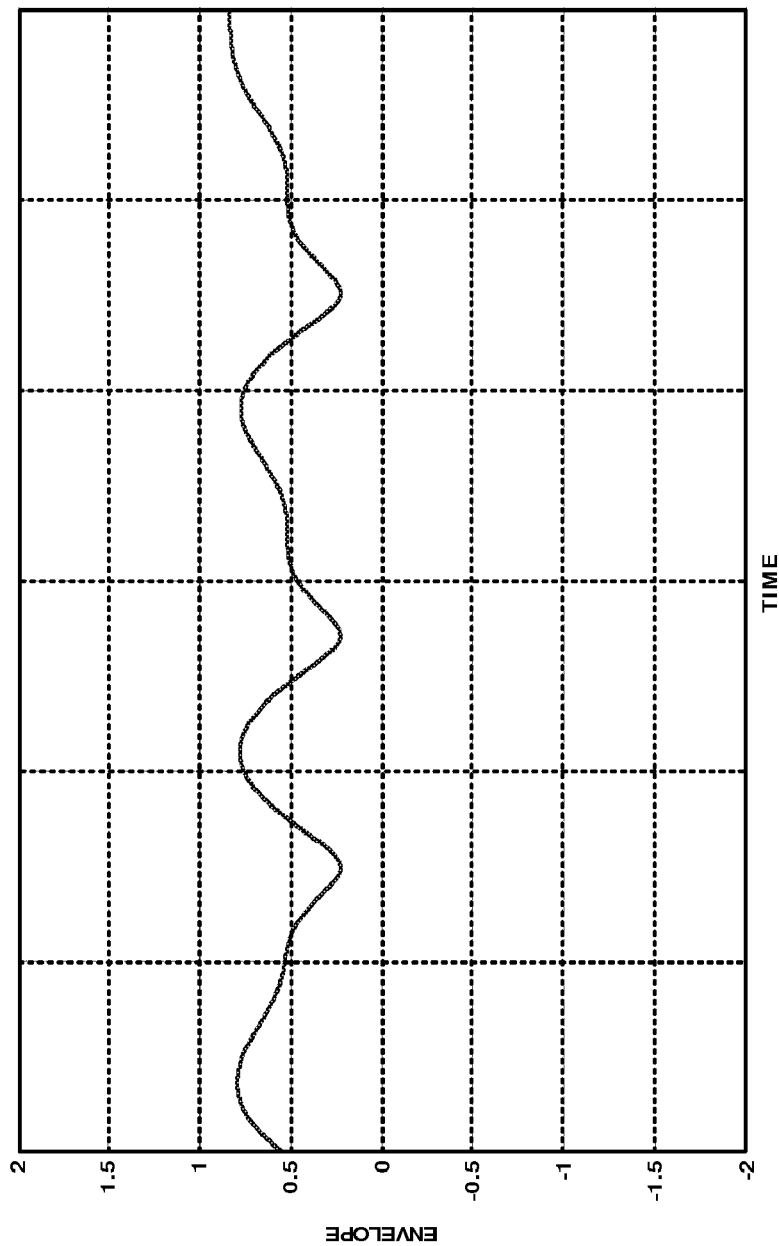
FIG. 6 shows a typical envelope signal, r(t), of an RF polar transmitter employed in an enhanced data rate GSM evolution (EDGE) cellular telephone system.
Figure 7:
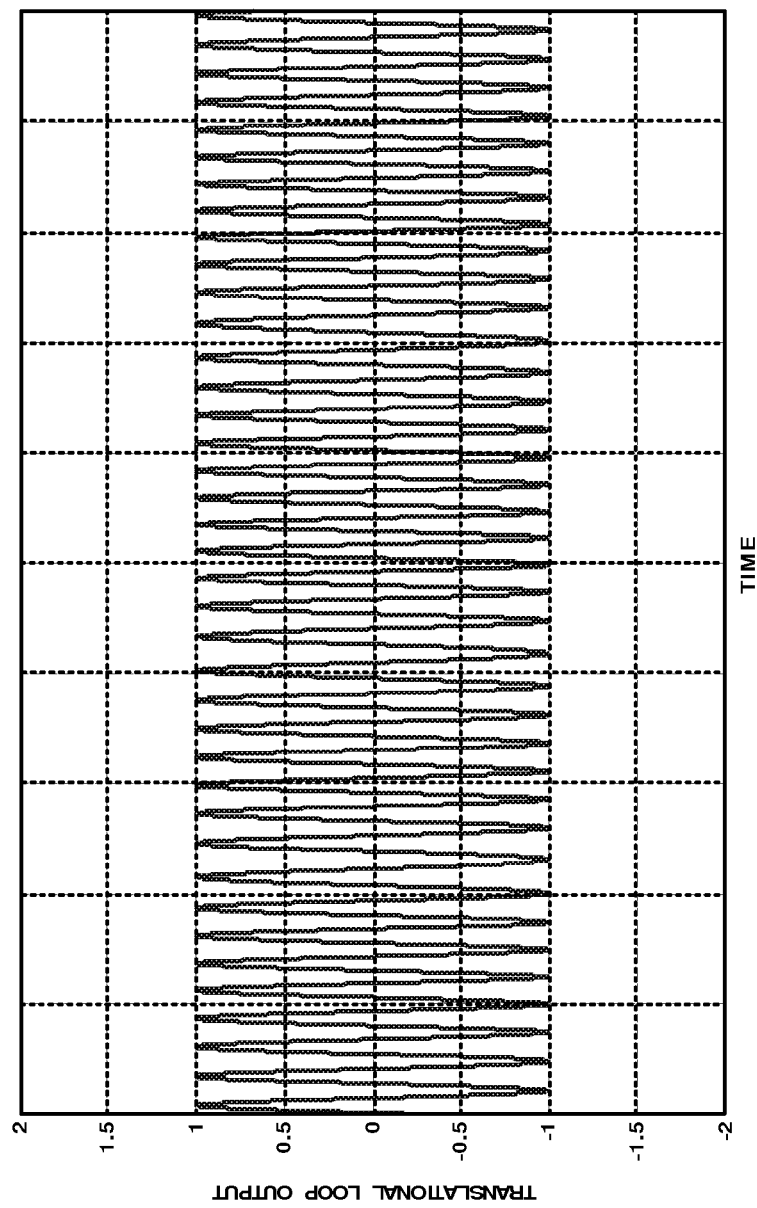
FIG. 7 is a typical output of the translational loop section of the polar transmitter employed in EDGE cellular telephony.
Figure 8:
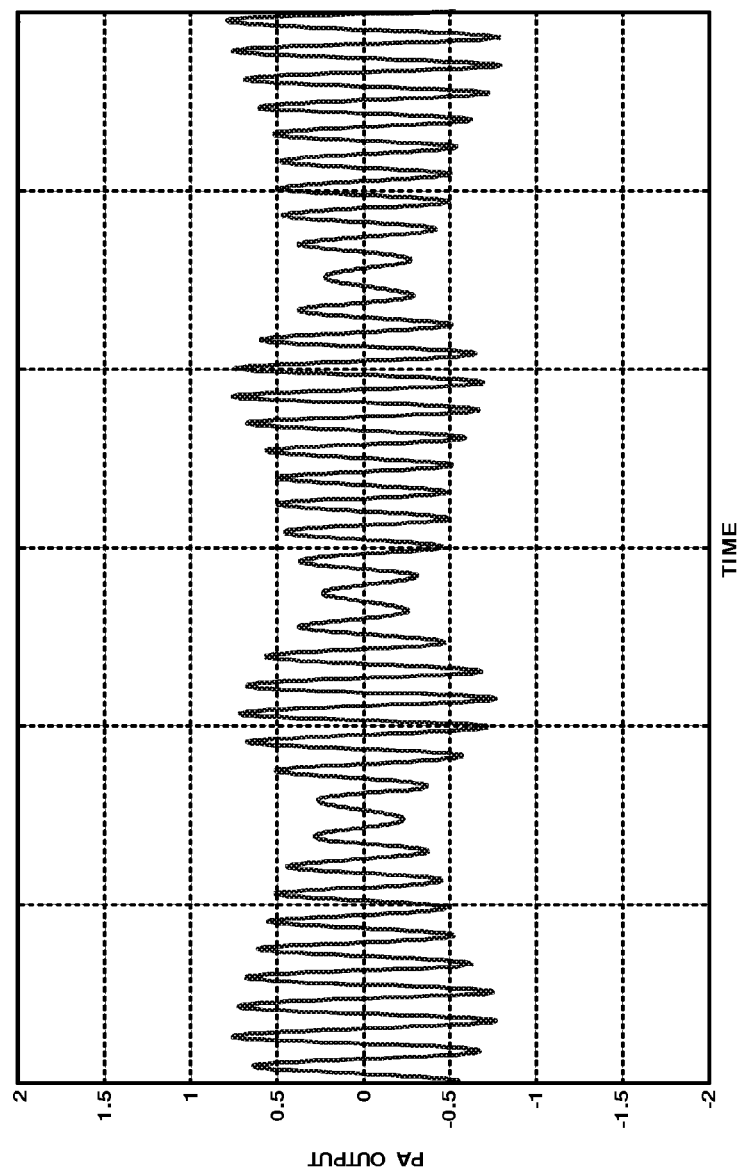
FIG. 8 is the PA output corresponding to modulating the translational loop output with the envelope signal. As is apparent, the resulting transmitter signal contains both amplitude and phase information.
Figure 9:
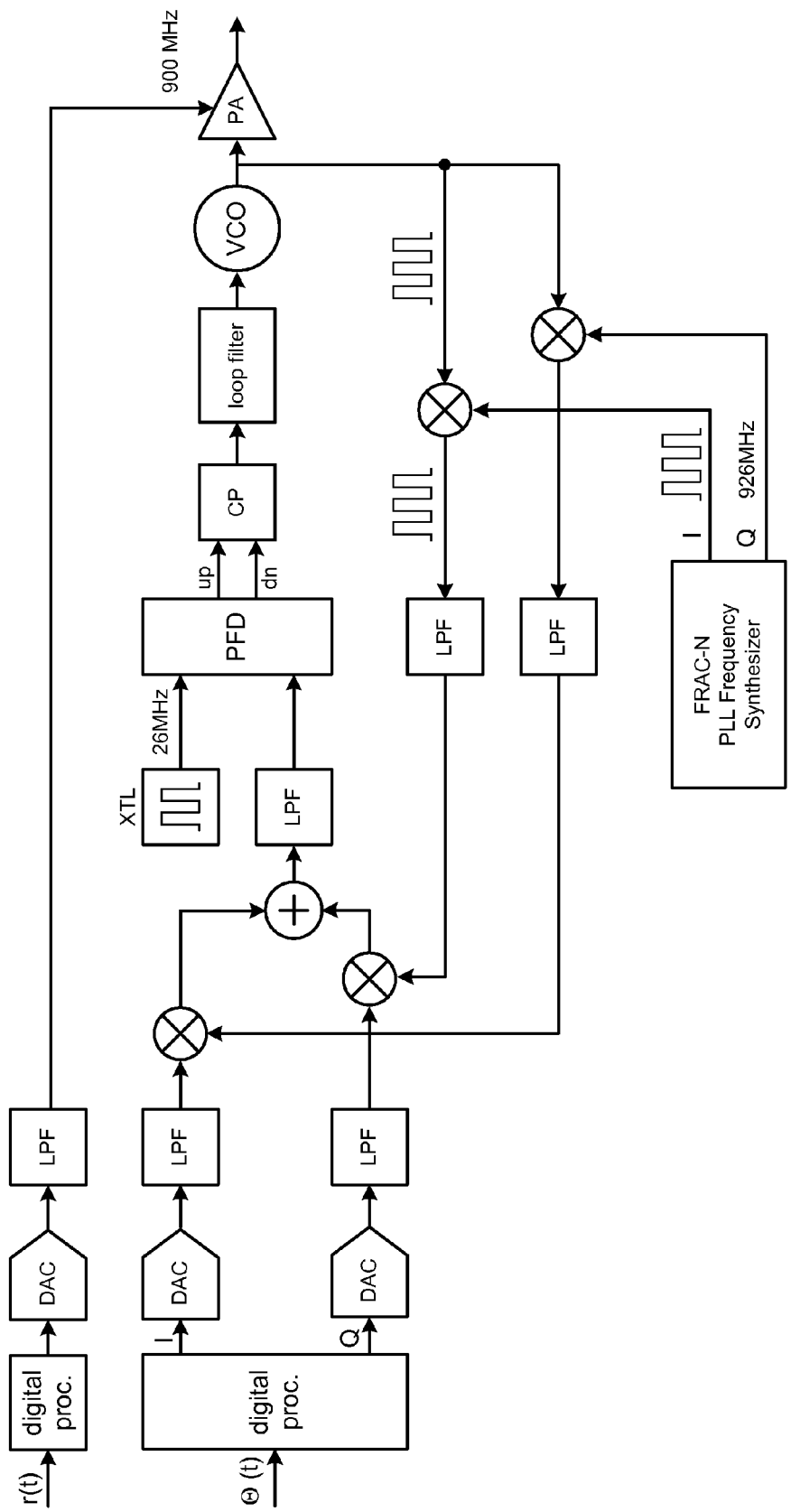
FIG. 9 shows further details of an example implementation of the polar transmitter for the EDGE cellular telephony application.
Figure 23:
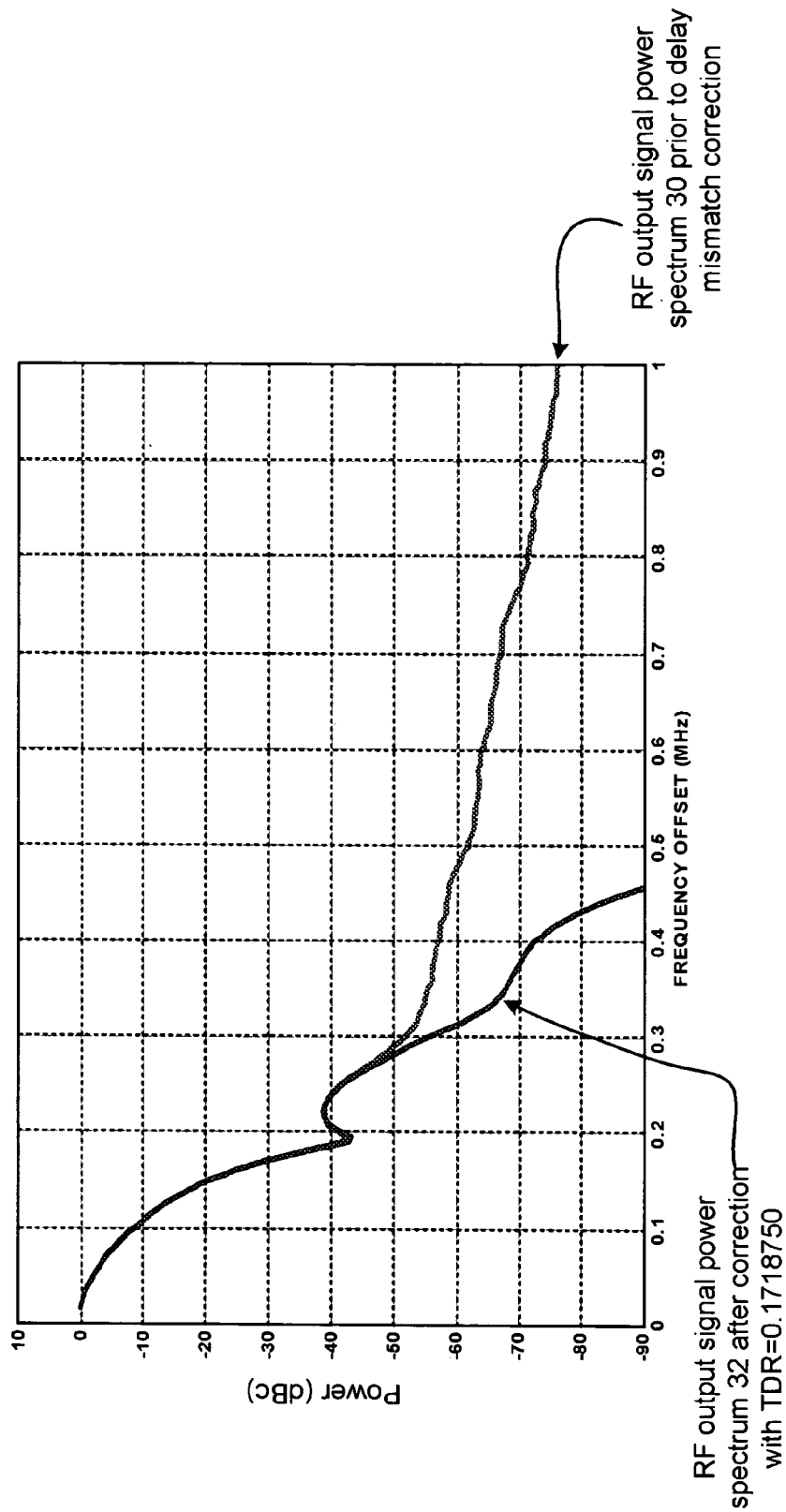
FIG. 23 is a response curve that illustrates the effectiveness of the described embodiments of invention for the RF polar transmitter.

FIG. 23 is a response curve that illustrates the effectiveness of the described embodiments of invention for the RF polar transmitter, as shown in FIG. 9, with an envelope and phase signal path delay mismatch of 52.884615 ns. for an EDGE signal. Since the clock frequency of the digital delay mismatch cancellation algorithm is 3.25 MHz, for optimal delay mismatch cancellation one would choose TRD=(52.884615 ns.)×(3.25 MHz)=0.1718750.

Figure 10:
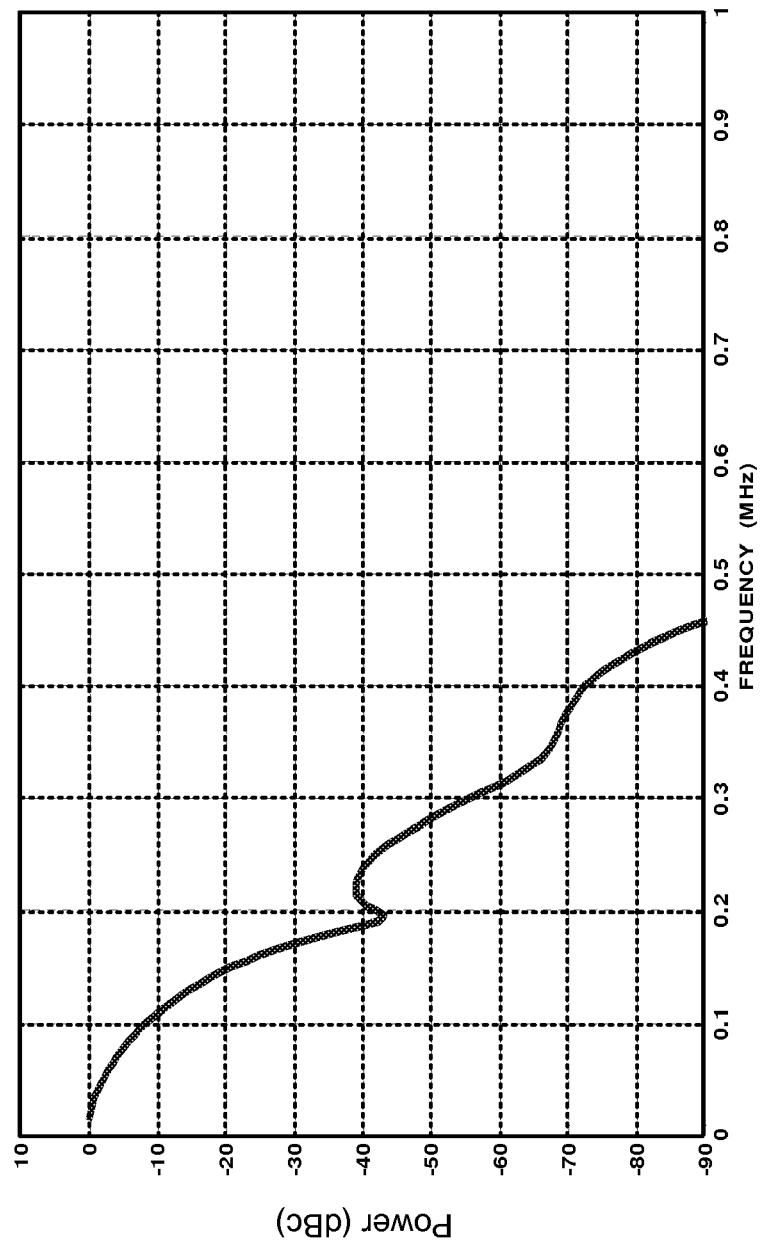
FIG. 10 shows an example of an ideal RF transmitter output signal power spectrum corresponding to the EDGE cellular telephony standard.
Figure 11:
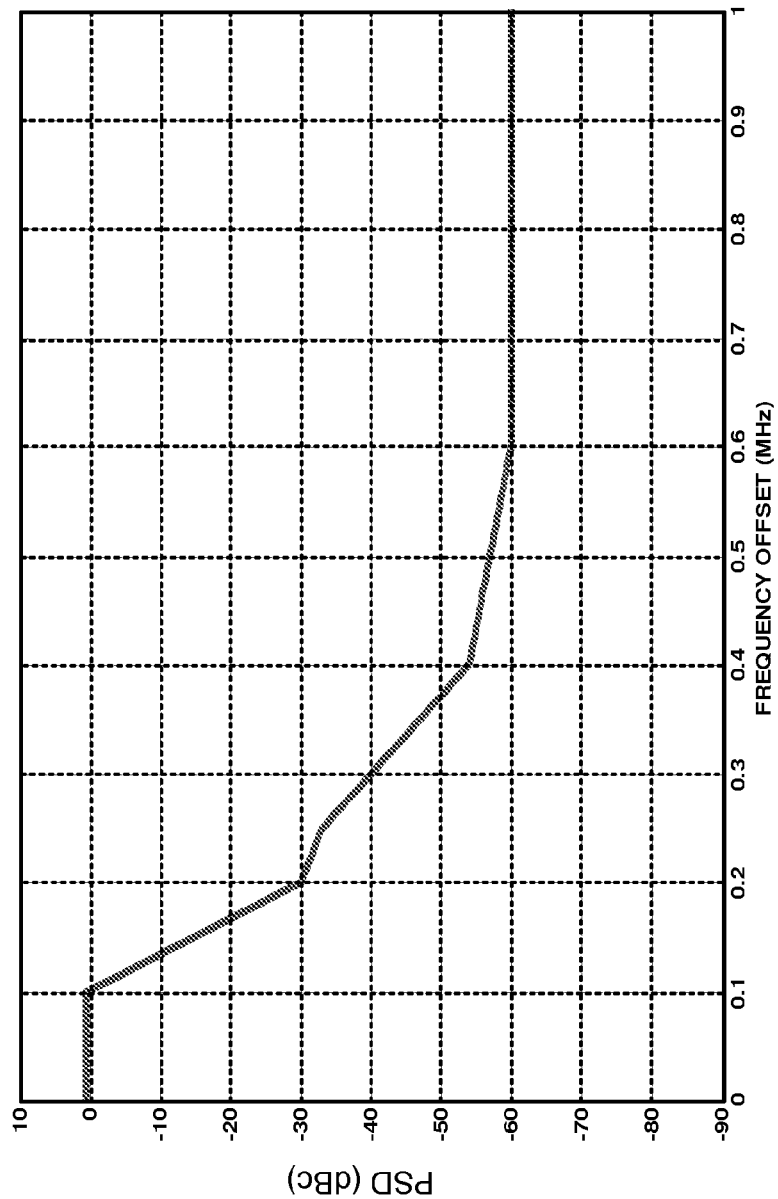
FIG. 11 shows a spectral mask of the EDGE cellular telephony standard in the frequency range 0-1 MHz.
Figure 12:
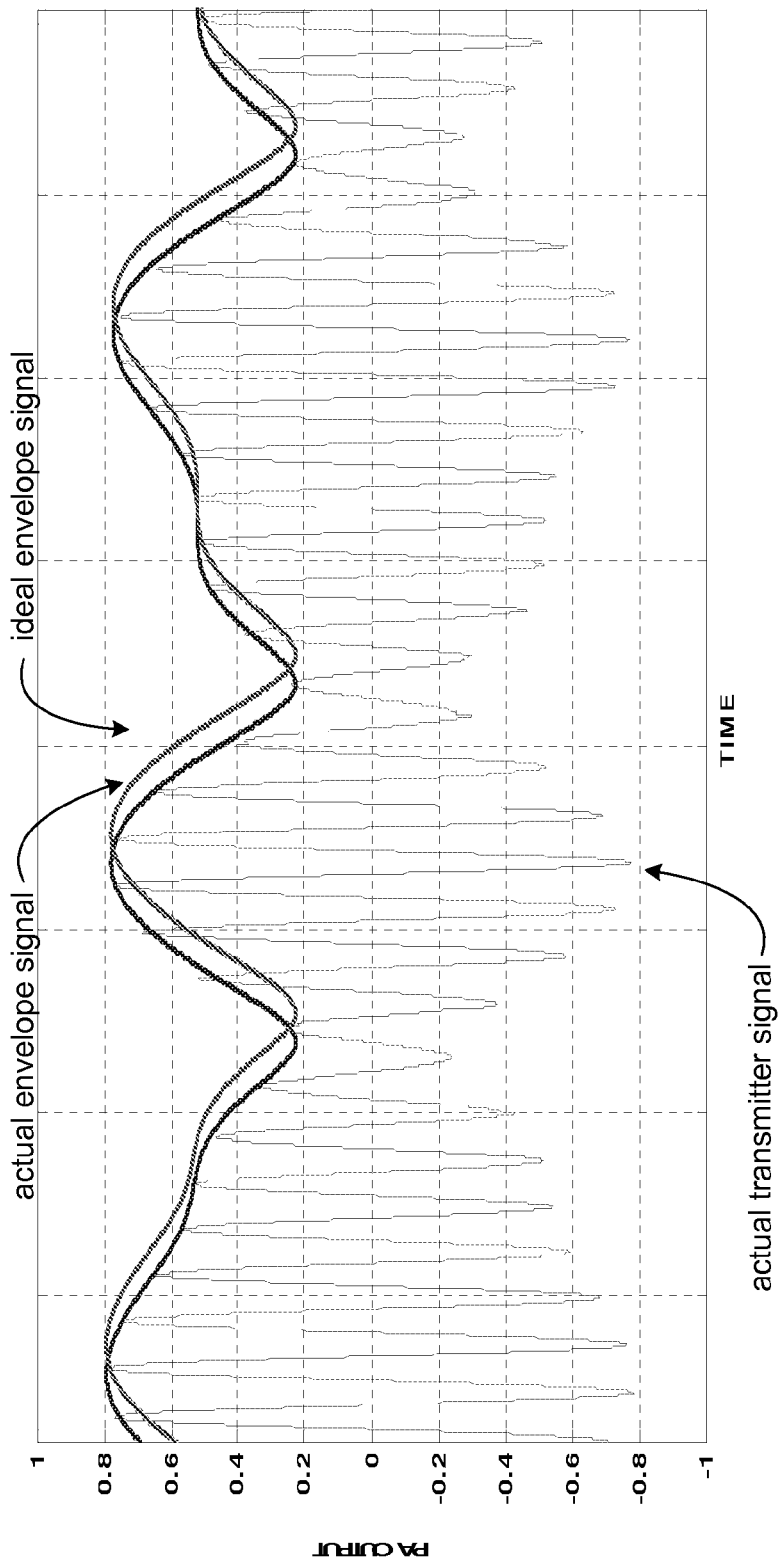
FIG. 12 illustrates the concept of delay mismatch between the envelope and phase signals for an example EDGE signal.
Figure 13:
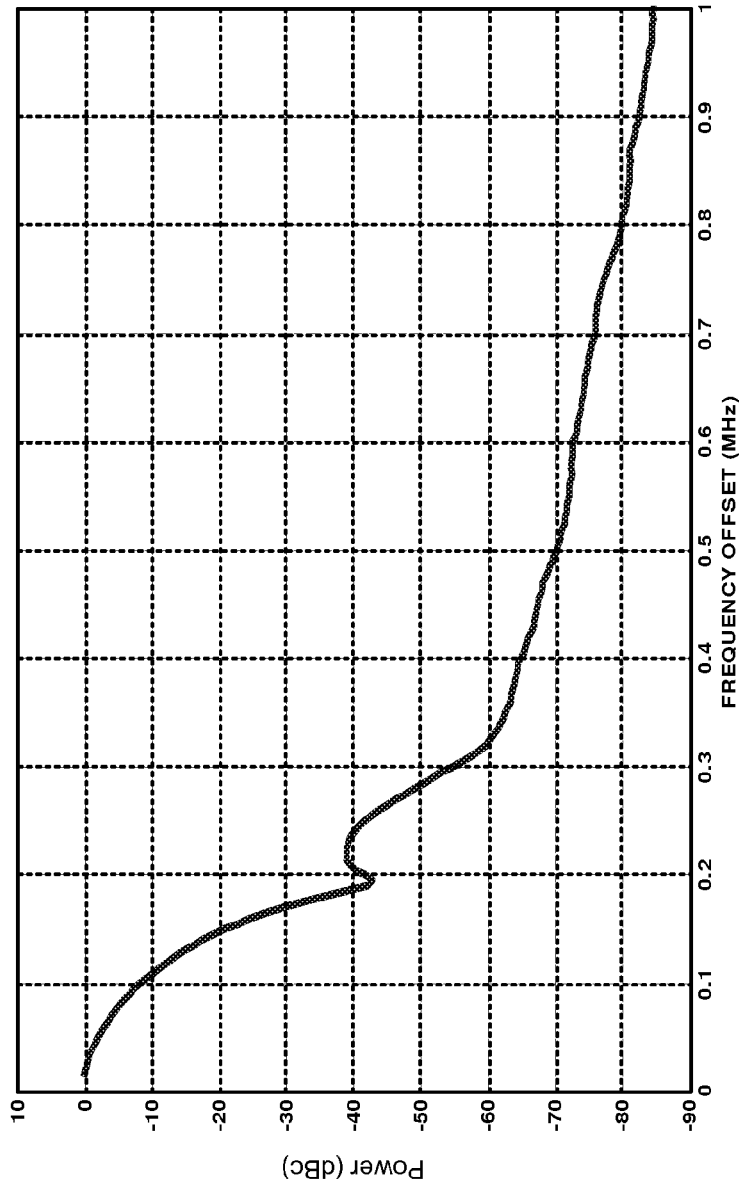
FIG. 13 shows an example RF signal output power spectrum corresponding to an EDGE signal with 20 nanosecond (nS) delay mismatch between the envelope and phase signal paths of the RF polar transmitter.

The graph shows an RF output signal power spectrum 30 prior to delay mismatch cancellation and an RF power spectrum 32 after cancellation for a TRD value set to 0.1718750. Comparing to FIG. 10, near-ideal transmitter output is achieved.

Figure 24:
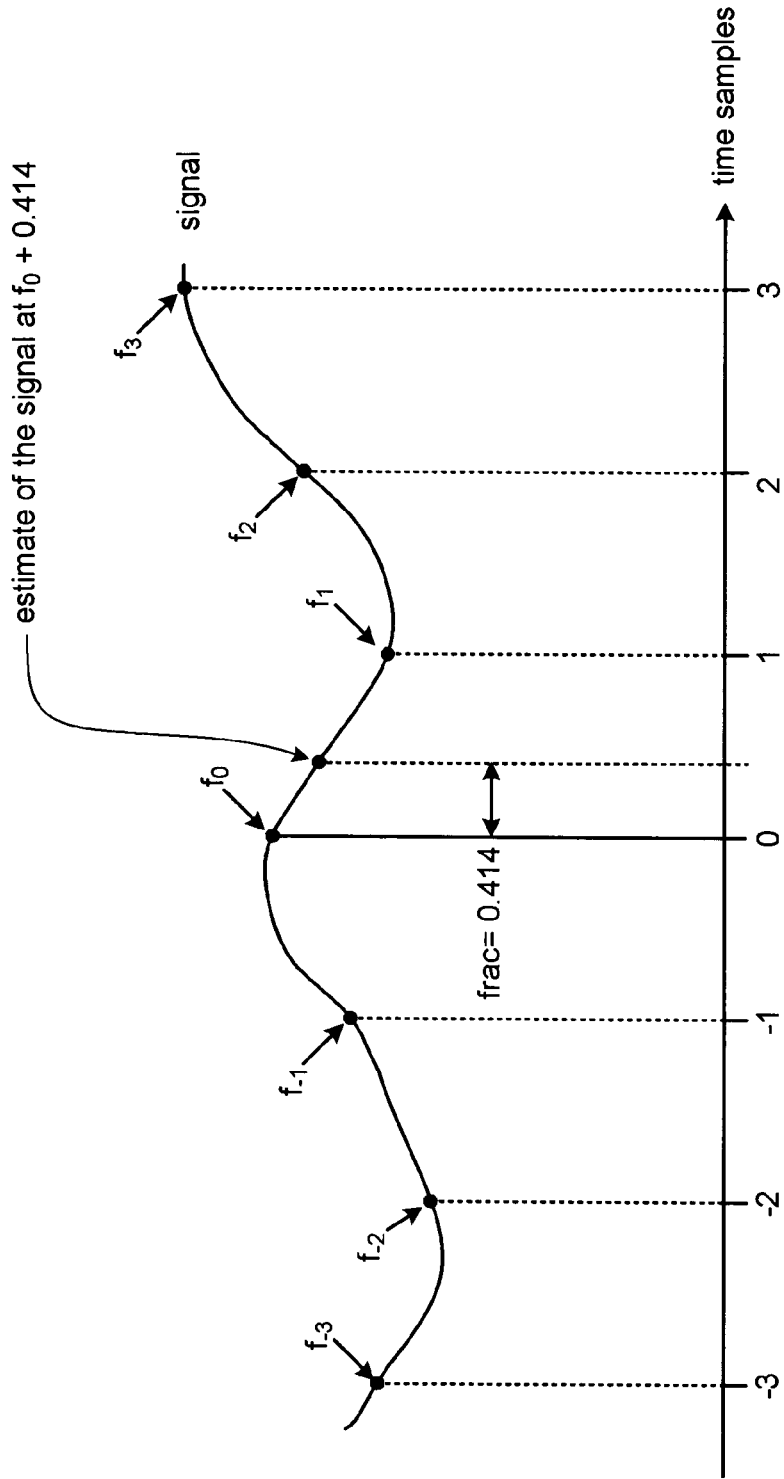
FIG. 24 is a graph illustrating derivative interpolation for producing a fractional delay in accordance with the present invention.

FIG. 24 is a graph illustrating derivative interpolation for producing a fractional delay in accordance with the present invention. A number of signal samples, $f_{-3}$ to $f_3$ in the example of FIG. 24, represent the instantaneous sampled value of the signal at each sample time. Due to the presence of downstream analog components, the envelope path or the phase path may experience a delay greater than or less than a delay in the other path. Identical delays in the envelope and phase paths do not effect the transmission of the signal. The difference in the path delays requires a sample clock with sufficient resolution such that an integer multiple of the sample clock rate will cancel the delay mismatch. This requires a sample clock to run faster than is practical within the constraints of power dissipation and voltage limitations. The present invention uses the theory of Clamped Cubic Splines to interpolate between signal samples to achieve fractional delays while using a "slower" sample clock rate that performs within the aforementioned constraints. In the example of FIG. 24, a fractional delay of 0.414 is needed. The derivatives of the signal at sample $f_0$ and at $f_1$ are estimated and used to derive an estimation of the signal amplitude at $f_0+0.414$. This sample value is inserted into the stream of data samples to produce the desired signal delay.

Figure 25:
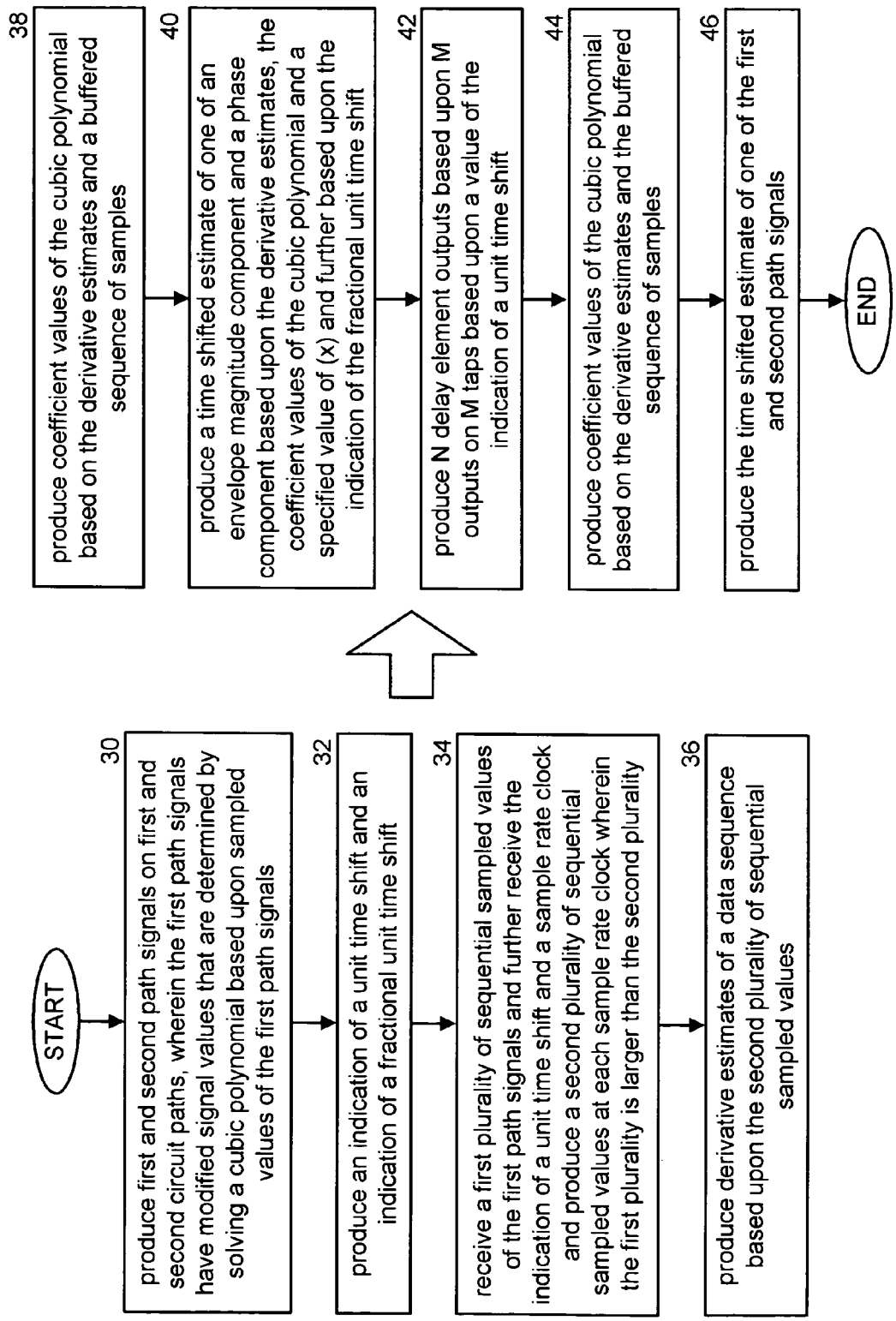
FIG. 25 is a flow chart of a method of the present invention.

FIG. 25 is a flow chart of a method of the present invention. The method of the present invention compensates data produced on a first circuit path for time shift in a second circuit path. The first circuit path or circuit path may be one of an envelope path or a phase path. The method of the present invention produces first and second path signals on the first and second circuit paths, wherein the first path signals have modified signal values that are determined by solving a cubic polynomial based upon sampled values of the first path signals (step 30). The coefficients of the solved cubic polynomial produce accurate estimates of the signal values when the derivatives of the endpoints of the signal on either side of the estimated are known.

The method thereafter produces an indication of a unit time shift and an indication of a fractional unit time shift (step 32) then receives a first plurality of sequential sampled values of the first path signals and further receiving the indication of a unit time shift and a sample rate clock and producing a second plurality of sequential sampled values at each sample rate clock wherein the first plurality is larger than the second plurality (step 34). As previously mentioned, the cubic polynomial method requires accurate estimates so the method produces derivative estimates of a data sequence based upon the second plurality of sequential sampled values (step 36).

The derivative estimates are used to produce coefficient values of the cubic polynomial based on the derivative estimates and a buffered sequence of samples (step 38). Once the coefficient values of the cubic polynomial are produced, the method produces a time shifted estimate of one of an envelope magnitude component and a phase component based upon the derivative estimates, the coefficient values of the cubic polynomial and a specified value of (x) and further based upon the indication of a fractional unit time shift (step 40). The time shifted estimate of one of an envelope magnitude component and a phase component represents an interpolated value of the path signal at the time shifted point.

Thereafter the method produces N delay element outputs based upon M outputs on M taps based upon a value of the indication of a unit time shift (step 42). The M output taps represents time delayed signal samples produced by a plurality of shift registers and the sample rate clock. The method thereafter performs mathematical operations equal to:

$$h(z) = \frac{1}{360}(1 - z^{-8}) + \frac{40}{360}(z^{-6} - z^{-2}) + \frac{256}{360}(z^{-3} - z^{-5})$$

that one of one of average skill in the art will recognize as the impulse response of an anti-symmetric FIR filter.

The method thereafter performs mathematical operations equal to:

$$a_0 = f(x_0)$$

$$a_1 = f'(x_0)$$

$$a_2 = 3(f(x_1) - f(x_0)) - (f'(x_1) + 2f'(x_0))$$

$$a_3 = 2(f(x_0) - f(x_1)) + f'(x_1) + f'(x_0)$$

wherein $x_n$ represents a signal sample and f' represents a derivative estimate of the signal at the sample point. The mathematical operations produce coefficient values of the cubic polynomial based on the derivative estimates and the buffered sequence of samples (step 44). Once the coefficient values are produced, the method then performs operations mathematically equal to $f(x) = (((a_3 x) + a_2)x + a_1)x + a_0$ wherein the nested algorithm allows the mathematical operation to be performed by successive multiplications and additions that can readily be implemented in hardware using adders and shift registers. The mathematical operations produce the time shifted estimate of one of the first and second path signals (step 46) wherein the time shifted estimate substantially cancels the delay experienced by one of the first and second signal paths.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

What is claimed is:

1. An RF transmitter, comprising:
   digital processor for producing outgoing digital IF signals comprising an envelope magnitude component and a phase component wherein the envelope magnitude component is produced on an envelope signal path and wherein the phase component is produced on a phase signal path, wherein the digital processor further includes a time shift block in at least one of the envelope and phase signal paths, wherein the time shift block implements a cubic polynomial that generates a time shift based upon a plurality of sequential sampled values of the outgoing digital IF signals to one of the envelope magnitude and phase components, the time shift block including:
   a derivative estimation block for producing derivative estimates of a data sequence based upon the plurality of sequential sampled values of the outgoing digital IF signals; and
   a clamped cubic spline (CCS) coefficient calculation block for producing coefficient values of the cubic polynomial based on the derivative estimates and a buffered sequence of samples;
   first and second digital to analog converters (DACs) on the envelope and phase signal paths coupled to receive the envelope magnitude and phase components, respectively, the first and second DACs producing outgoing analog envelope and phase components;
   first and second low pass filters for producing filtered outgoing magnitude and phase components, respectively, based upon the outgoing magnitude and phase components;
   translational loop for up-converting the filtered outgoing phase component from IF to RF to produce an outgoing RF phase component; and
   power amplifier that produces outgoing RF based upon the outgoing RF phase component having an outgoing power level based upon the filtered outgoing magnitude component.

2. The RF transmitter of claim 1 wherein the time shift block further includes:
   a time shift split block that produces an indication of a unit time shift and an indication of a fractional unit time shift; and
   a signal buffer coupled to receive the plurality of sequential sampled values of the outgoing digital IF signals, the indication of a unit time shift, and a sample rate clock wherein the signal buffer produces the plurality of sequential sampled values at each sample clock.

3. The RF transmitter of claim 2 further including a clamped cubic spline (CCS) evaluation block for producing the time shifted estimate of one of the envelope magnitude and phase components based upon the derivative estimates, the coefficient values of the cubic polynomial and a specified value of an interpolation point at which an estimate of the cubic polynomial is desired and further based upon the indication of the fractional unit time shift.

4. The RF transmitter of claim 3 wherein the signal buffer comprises a plurality of delay elements sequentially coupled and a tap on an output of each delay element and further comprises a multiplexer coupled to receive the indication of the unit time shift, the multiplexer producing delay element outputs based upon the outputs on the taps and based upon a value of the indication of the unit time shift.

5. The RF transmitter of claim 4 wherein the derivative estimation block includes an anti-symmetric FIR filter with an impulse response that is based upon the delay element outputs to produce the derivate estimates.

6. A digital processor for producing outgoing digital IF signals comprising an envelope magnitude component and a phase component wherein the envelope magnitude component is produced on an envelope signal path and wherein the phase component is produced on a phase signal path, comprising:
- a time shift block in at least one of the envelope and phase signal paths; wherein the time shift block implements a cubic polynomial that generates a time shift based upon a plurality of sequential sampled values of the outgoing digital IF signals to one of the envelope magnitude and phase components, the time shift block including:
  - a derivative estimation block for producing derivative estimates of a data sequence based upon the plurality of sequential sampled values of the outgoing digital IF signals; and
  - a clamped cubic spline (CCS) coefficient calculation block for producing coefficient values of the cubic polynomial based on the derivative estimates and a buffered sequence of samples.

7. The digital processor of claim 6 wherein the time shift block further includes:
- a time shift split block that produces an indication of a unit time shift and an indication of a fractional unit time shift; and
- a signal buffer coupled to receive the plurality of sequential sampled values of the outgoing digital IF signals, the indication of a unit time shift, and a sample rate clock wherein the signal buffer produces the plurality of sequential sampled values at each sample clock.

8. The digital processor of claim 7 further including a CCS evaluation block for producing the time shifted estimate of one of the envelope magnitude and phase components based upon the derivative estimates, the coefficient values of the cubic polynomial and a specified value of an interpolation point at which an estimate of the cubic polynomial is desired and further based upon the indication of the fractional unit time shift.

9. The digital processor of claim 8 wherein the signal buffer comprises a plurality of delay elements sequentially coupled and a tap on an output of each delay element and further comprises a multiplexer coupled to receive the indication of the unit time shift, the multiplexer producing delay element outputs based upon the outputs on the taps and based upon a value of the indication of the unit time shift.

10. The digital processor of claim 9 wherein the derivative estimation block includes an anti-symmetric FIR filter with an impulse response that is based upon the delay element outputs to produce the derivate estimates.

11. A method of producing outgoing digital IF signals, comprising:
- producing first and second path signals corresponding to the outgoing digital IF signals on first and second circuit paths, respectively;
- producing an indication of a unit time shift;
- receiving a first plurality of sequential sampled values of the first path signals and further receiving the indication of the unit time shift and a sample rate clock; and
- producing a second plurality of sequential sampled values at each sample clock of the sample rate clock, wherein the first plurality is larger than the second plurality;
- wherein the first path signals have modified signal values that are determined by solving a cubic polynomial based upon the first plurality of sequential sampled values of the first path signals.

12. The method of claim 11 further including producing an indication of a fractional unit time shift.

13. The method of claim 12 further including producing derivative estimates of a data sequence based upon the second plurality of sequential sampled values.

14. The method of claim 13 further including producing coefficient values of the cubic polynomial based on the derivative estimates and a buffered sequence of samples.

15. The method of claim 14 further including producing a time shifted estimate of one of an envelope magnitude component and a phase component based upon the derivative estimates, the coefficient values of the cubic polynomial and a specified value of (x) and further based upon the indication of the fractional unit time shift.

16. The method of claim 15 further including producing delay element outputs based upon outputs on taps and based upon the value of the indication of the unit time shift.

17. The method of claim 15 wherein the producing the derivative estimates further includes:
- using an anti-symmetric FIR filter with an impulse response that is based upon the delay element outputs to produce the derivate estimates.

* * * * *